(12) United States Patent
Katti et al.

(10) Patent No.: US 10,871,529 B2
(45) Date of Patent: Dec. 22, 2020

(54) SPINTRONIC MECHANICAL SHOCK AND VIBRATION SENSOR DEVICE

(71) Applicant: Honeywell International Inc., Morris Plains, NJ (US)

(72) Inventors: Romney R. Katti, Shorewood, MN (US); Edward F. Ambrose, Inver Grove Heights, MN (US)

(73) Assignee: Honeywell International Inc., Charlotte, NC (US)

( * ) Notice: Subject to any disclaimer, the term of this patent is extended or adjusted under 35 U.S.C. 154(b) by 106 days.

(21) Appl. No.: 16/195,588

(22) Filed: Nov. 19, 2018

(65) Prior Publication Data
US 2020/0081077 A1  Mar. 12, 2020

Related U.S. Application Data

(60) Provisional application No. 62/729,891, filed on Sep. 11, 2018.

(51) Int. Cl.
| | | |
|---|---|---|
| *G01R 33/09* | (2006.01) | |
| *G11C 11/16* | (2006.01) | |
| *H01F 10/32* | (2006.01) | |
| *H01L 43/08* | (2006.01) | |

(52) U.S. Cl.
CPC ........ *G01R 33/098* (2013.01); *G11C 11/1673* (2013.01); *H01F 10/3254* (2013.01); *H01L 43/08* (2013.01)

(58) Field of Classification Search
None
See application file for complete search history.

(56) References Cited

U.S. PATENT DOCUMENTS

| | | | |
|---|---|---|---|
| 5,764,567 | A | 6/1998 | Parkin |
| 5,962,782 | A | 10/1999 | O'Keefe et al. |
| 6,052,263 | A | 4/2000 | Gill |
| 6,131,457 | A | 10/2000 | Sato |
| 6,507,187 | B1 | 1/2003 | Olivas et al. |
| 7,145,330 | B2 | 12/2006 | Xiao |
| 7,239,543 | B2 | 7/2007 | Chung et al. |
| 7,547,480 | B2 | 6/2009 | Chung et al. |

(Continued)

FOREIGN PATENT DOCUMENTS

| | | |
|---|---|---|
| CN | 102853826 A | 1/2013 |
| CN | 206132803 U | 4/2017 |

(Continued)

OTHER PUBLICATIONS

Extended Search Report from counterpart European Application No. 19195762.0, dated Feb. 19, 2020, 8 pp.

(Continued)

*Primary Examiner* — Jermele M Hollington
(74) *Attorney, Agent, or Firm* — Shumaker & Sieffert, P.A.

(57) ABSTRACT

A magnetic tunnel junction (MTJ) based sensor device includes a MTJ element and processing circuitry. The MTJ element includes a free layer, a pinned layer, an elastic layer, and a tunnel barrier. The free layer is spaced apart from the pinned layer by the tunnel barrier and the elastic layer. The processing circuitry is configured to measure a resistance at the MTJ element and determine whether mechanical shock and vibration has occurred based on the resistance at the MTJ element.

20 Claims, 20 Drawing Sheets

(56) References Cited

U.S. PATENT DOCUMENTS

| | | |
|---|---|---|
| 7,635,974 B2 | 12/2009 | Guo et al. |
| 7,656,622 B2 | 2/2010 | Tera et al. |
| 7,690,263 B2 | 4/2010 | Jen et al. |
| 7,732,881 B2 | 6/2010 | Wang |
| 7,738,286 B2 | 6/2010 | Ito et al. |
| 8,068,316 B2 | 11/2011 | Dieny et al. |
| 8,104,345 B2 | 1/2012 | Bruckl et al. |
| 8,120,127 B2 | 2/2012 | Nagahara et al. |
| 8,698,260 B2 | 4/2014 | Jan et al. |
| 8,830,737 B2 | 9/2014 | Keshtbod et al. |
| 8,836,056 B2 | 9/2014 | Oguz et al. |
| 9,250,070 B2 | 2/2016 | Wootten |
| 9,254,992 B2 | 2/2016 | Ju |
| 9,489,998 B1 | 11/2016 | Schafer |
| 10,008,248 B2 | 6/2018 | Buhrman et al. |
| 10,060,941 B2* | 8/2018 | Bai .................. G01P 3/54 |
| 2009/0321860 A1* | 12/2009 | Klostermann .......... H01L 43/08 257/421 |
| 2015/0082888 A1 | 3/2015 | Otsu et al. |
| 2016/0153780 A1 | 6/2016 | Zhang et al. |
| 2017/0016784 A1* | 1/2017 | Katti ................... G01L 1/16 |
| 2017/0092846 A1 | 3/2017 | Doyle et al. |
| 2017/0160308 A1 | 6/2017 | Alaoui |
| 2017/0194554 A1* | 7/2017 | Kim .................. G06F 13/4282 |
| 2017/0249550 A1 | 8/2017 | Sengupta et al. |
| 2018/0190899 A1 | 7/2018 | Kim et al. |
| 2020/0080844 A1* | 3/2020 | Katti .................. H01L 27/22 |
| 2020/0081078 A1* | 3/2020 | Katti .................. H01F 10/3254 |

FOREIGN PATENT DOCUMENTS

| | | |
|---|---|---|
| CN | 106645797 A | 5/2017 |
| CN | 104567848 B | 9/2017 |
| CN | 107255737 A | 10/2017 |
| CN | 107421525 A | 12/2017 |
| EP | 3118596 A1 | 1/2017 |
| WO | 2018125142 A | 7/2018 |

OTHER PUBLICATIONS

Response to Extended Search Report dated Feb. 19, 2020, from counterpart European Application No. 19195762.0, filed Mar. 6, 2020, 18 pp.

Lirkov et al., "Large-Scale Scientific Computing," 10th International Conference, LSSC 2015, Jun. 8, 2015, 442 pp.

Elwell, et al., "The development of magnetic tunnel junction fabrication techniques," Jul. 31, 200, 231 pp.

\* cited by examiner

SPINTRONIC MECHANICAL SHOCK AND VIBRATION SENSOR DEVICE

PRIORITY CLAIM

This application claims the benefit of U.S. Provisional Patent Application No. 62/729,891, filed Sep. 11, 2018, the entire content of which is incorporated herein by reference.

TECHNICAL FIELD

This disclosure relates to sensor devices and, more specifically, to spintronic-based devices that are configured to detect mechanical shock and vibration.

BACKGROUND

Some electrical device include a mechanical shock and vibration sensor that monitors vibrations and mechanical shock occurring at an electrical device. It is desirable for such electrical devices to detect vibrations and mechanical shock occurring at the electrical device to protect the device from operating during an unsafe condition. For example, an electrical device may disable processes performed by the electrical device when significant vibrations and mechanical shock are occurring at the electrical device.

It is generally desirable for a mechanical shock and vibration sensor to accurately measure vibrations and mechanical shock and to operate in a smaller space. Current types of mechanical shock and vibration sensors include piezoelectric displacement transducer that generates a voltage when deformed. Other types of mechanical shock and vibration sensors include an electromagnetic coil and magnet system to generate a velocity signal that can be used to estimate vibrations and mechanical shock.

SUMMARY

This disclosure generally describes techniques for detecting vibrations and mechanical shock using a spintronic based sensor device. The techniques may in some instances provide for a higher data density for a smaller and more lightweight form factor. Furthermore, a spintronic based sensor device may be more resistive to ElectroMagnetic Interference (EMI) than a piezoelectric displacement transducer and electromagnetic coil and magnet system, which may be of particular benefit to certain applications.

In one example, a magnetic tunnel junction (MTJ) based sensor device includes a MTJ element comprising a free layer, a pinned layer, an elastic layer, and a tunnel barrier, the free layer being spaced apart from the pinned layer by the tunnel barrier and the elastic layer; and processing circuitry configured to: measure a resistance at the MTJ element; and determine whether mechanical shock and vibration has occurred based on the resistance at the MTJ element.

In another example, a method for detecting mechanical shock and vibration using a MTJ based sensor device includes measuring, by processing circuitry, a resistance at a MTJ element, wherein the MTJ element comprises a free layer, a pinned layer, an elastic layer, and a tunnel barrier, the free layer being spaced apart from the pinned layer by the tunnel barrier and the elastic layer; and determining, by the processing circuitry, whether mechanical shock and vibration has occurred based on the resistance at the MTJ element.

In another example, a MTJ based sensor device includes means for measuring a resistance at a MTJ element, wherein the MTJ element comprises a free layer, a pinned layer, an elastic layer, and a tunnel barrier, the free layer being spaced apart from the pinned layer by the tunnel barrier and the elastic layer; and means for determining whether mechanical shock and vibration has occurred based on the resistance at the MTJ element.

The details of one or more aspects of the disclosure are set forth in the accompanying drawings and the description below. Other features, objects, and advantages of the devices, systems, methods, and techniques described in this disclosure will be apparent from the description and drawings, and from the claims.

DETAILED DESCRIPTION

Some applications have been identified in which miniaturized sensing devices are needed for operation in unique environments. Such sensing devices may be configurable for strategic applications. For example, such sensing devices may be radiation-hardened and designed to include magnetically-based devices that can be integrated (e.g., monolithically, in particular initially) into a compact module with application-specific integrated circuits (ASICs) including those that contain embedded Magnetoresistive Random Access Memory (MRAM) bits. Of various sensing devices of interest, one device of interest that is discussed here is a mechanical shock and vibration sensor device that could be used with or separately from other sensors (e.g., a gyroscope, an accelerometer, etc.), and that may support compatibility with MRAM technology.

In accordance with one or more techniques described herein, circuitry may be constructed to include a magnetic tunnel junction (MTJ), which is an example of a spintronic device, with desired, resistance, resistance-area product, and dimensions. Examples of resistance and/or magnetoresistance may include, but are not limited to, tunnel magnetoresistance (TMR), giant magnetoresistance (GMR), anisotropic magnetoresistive (AMR), and other resistance and/or magnetoresistance effects.

Within a tunnel barrier structure between two magnetic layers of the MTJ, techniques described herein may include an elastic layer, either centrally, towards one edge, at one edge, to the other edge, and/or at the other edge and/or a gap layer that can support one or more bending/flex modes by construction, such as with edge supports. The sensing modes may make use of electrical, electronic, or spintronic current(s). Tunneling current(s) can be spin-dependent or spin-independent and, ballistic electron tunneling may be used to sense mechanical shock and vibration. Anisotropic, Giant, and/or Tunneling Magneto-Resistive effects may be used for sensing shock and/or vibration motions. Such flexing by the elastic layer may cause a corresponding change in resistance of the MTJ. In this way processing circuitry, may detect mechanical shock and vibration using the resistance of the MTJ.

Such magnetic/spintronic devices may provide unique and desired application functionality, customization prospects, and environmental capability (e.g., shock, vibration, radiation, acceleration, motion) for various environments. Such magnetic/spintronic devices may offer materials and technological similarity and compatibility with MRAM bits and other sensing devices such as accelerometers, gyros, and pressure sensors, which may support integration, modularity, miniaturization, and packaging with embedded MRAM and ASICS.

Figure 1A:
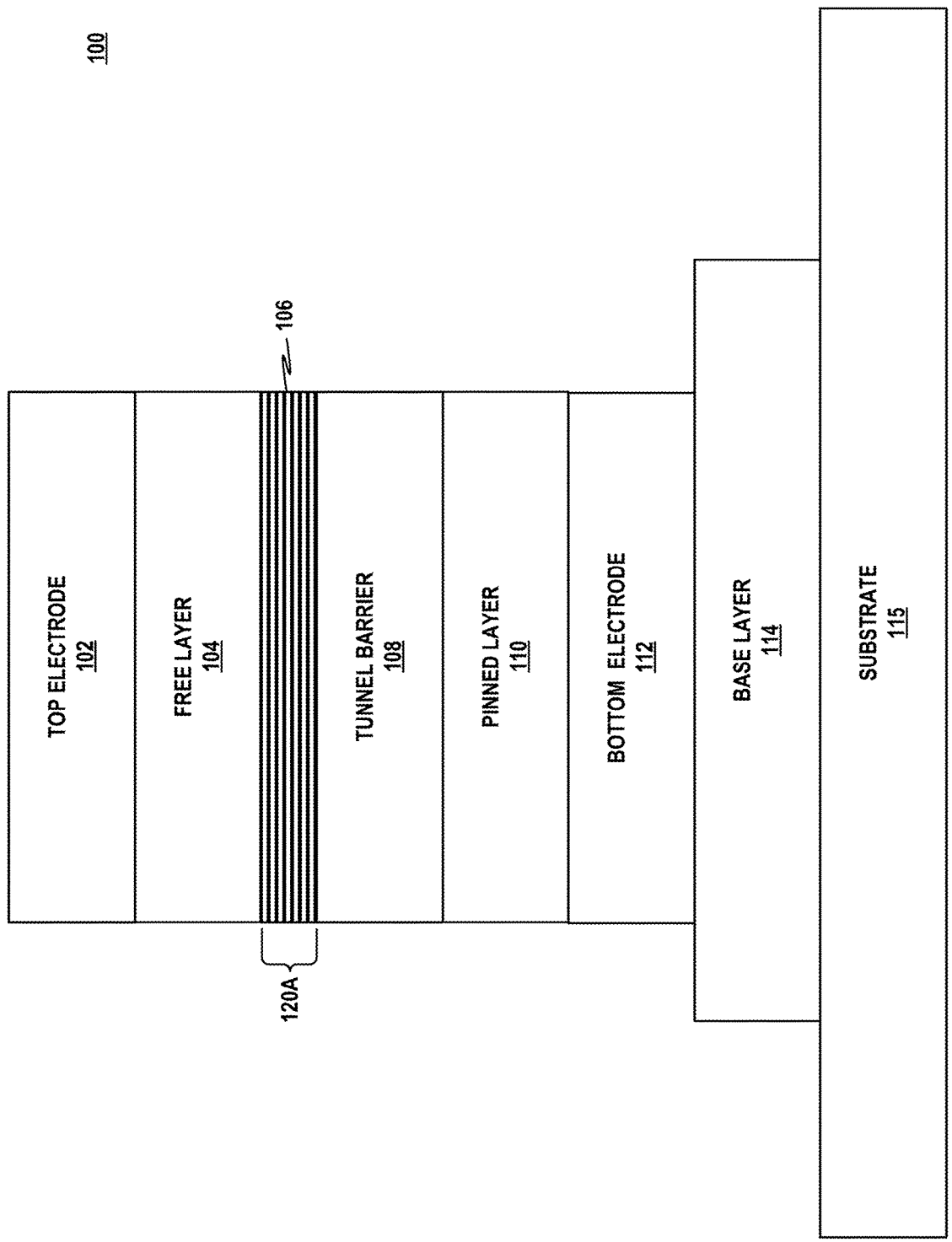
FIG. 1A shows a conceptual illustration of a first magnetic tunnel junction (MTJ) element configured to detect vibrations and mechanical shock.

FIG. 1A shows a conceptual illustration of a first MTJ element 100 configured to detect vibrations and mechanical shock. MTJ element 100 may include top electrode 102, free layer 104, elastic layer 106, tunnel barrier 108, pinned layer 110, bottom electrode 112, base layer 114, and substrate 115. Base layer 114 may comprise, for example, silicon (Si).

Substrate 115 may comprise, for example, silicon (Si). In some examples, substrate 115 may include processing circuitry. For example, substrate 115 may include metallization and/or integrated circuitry (e.g., Complementary metal-oxide-semiconductor (CMOS)).

Top electrode 102 and bottom electrode 112 may be formed of a conductive material to permit a connection to read a state of MTJ element 100. Examples of conductive materials may include, but are not limited to, aluminum, copper, titanium, and/or tantalum.

Free layer 104 may include a magnetization direction that is free to switch between a parallel orientation and an antiparallel orientation. Tunnel barrier 108 includes a non-magnetic metal that separates free layer 104 and pinned layer 110. In some examples, tunnel barrier 108 may be formed of aluminum oxide, magnesium oxide, or another material.

Elastic layer 106 may support one or more bending and/or flex modes. For example, elastic layer 106 may bend and/or flex in response to mechanical shock and vibration. In MTJ element 100, elastic layer 106 is arranged between free layer 104 and tunnel barrier 108. In FIG. 1A, elastic layer 106 has a thickness 120A. Elastic layer 106 may comprise one or more sheets of Carbon, Graphene, an Elastomer, or another elastic material. Examples of an Elastomers may include, but are not limited to, Isoprene, Neoprene, or another Elastomer. Polymers and hydrocarbons are also candidate materials. Elastic layer 106 may be deposited using sputtering, plasma, Physical Vapor Deposition (PVD), Chemical Vapor Deposition (CVD), or other techniques.

Elastic layer 106 may be configured with a thickness and/or width according to one or more design parameters. For example, a human being may select a thickness of elastic layer 106 using various factors, for example, but not limited to, an expected level of shock, an expected frequency of shock, a frequency range of shock, a sensitivity level, or another factor. For instance, a human being may select thickness 120A of elastic layer 106 and/or a width of elastic layer 106 for a low shock application.

Pinned layer 110 may include a magnetization direction that is fixed or "pinned" to a single orientation. For example, pinned layer 110 may be pinned in a parallel orientation. In other examples, pinned layer 110 may be pinned in an antiparallel orientation. In the example of FIG. 1A, pinned layer 110 may include an anti-ferromagnetic layer, such that the magnetization direction of the pinned layer 110 is "pinned" in a particular orientation the magnetization direction of the pinned layer 110 remains relatively fixed when operational magnetic fields are applied to MTJ element 100.

In the example of FIG. 1A, a magnetization direction of free layer 104 is used to determine whether MTJ element 100 is experiencing mechanical shock and vibration. For example, processing circuitry may detect a magnitude of magnetization using a resistance and/or magnetoresistance of the MTJ element 100. In this manner, MTJ element 100 may be used as a mechanical shock and vibration sensor device.

More specifically, for example, MTJ element 100 includes free layer 104, pinned layer 110, elastic layer 106, and tunnel barrier 108, free layer 104 being spaced apart from pinned layer 110 by tunnel barrier 108 and elastic layer 106. In the example of FIG. 1A, free layer 104 is spaced apart from tunnel barrier 108 by elastic layer 106.

Figure 1B:
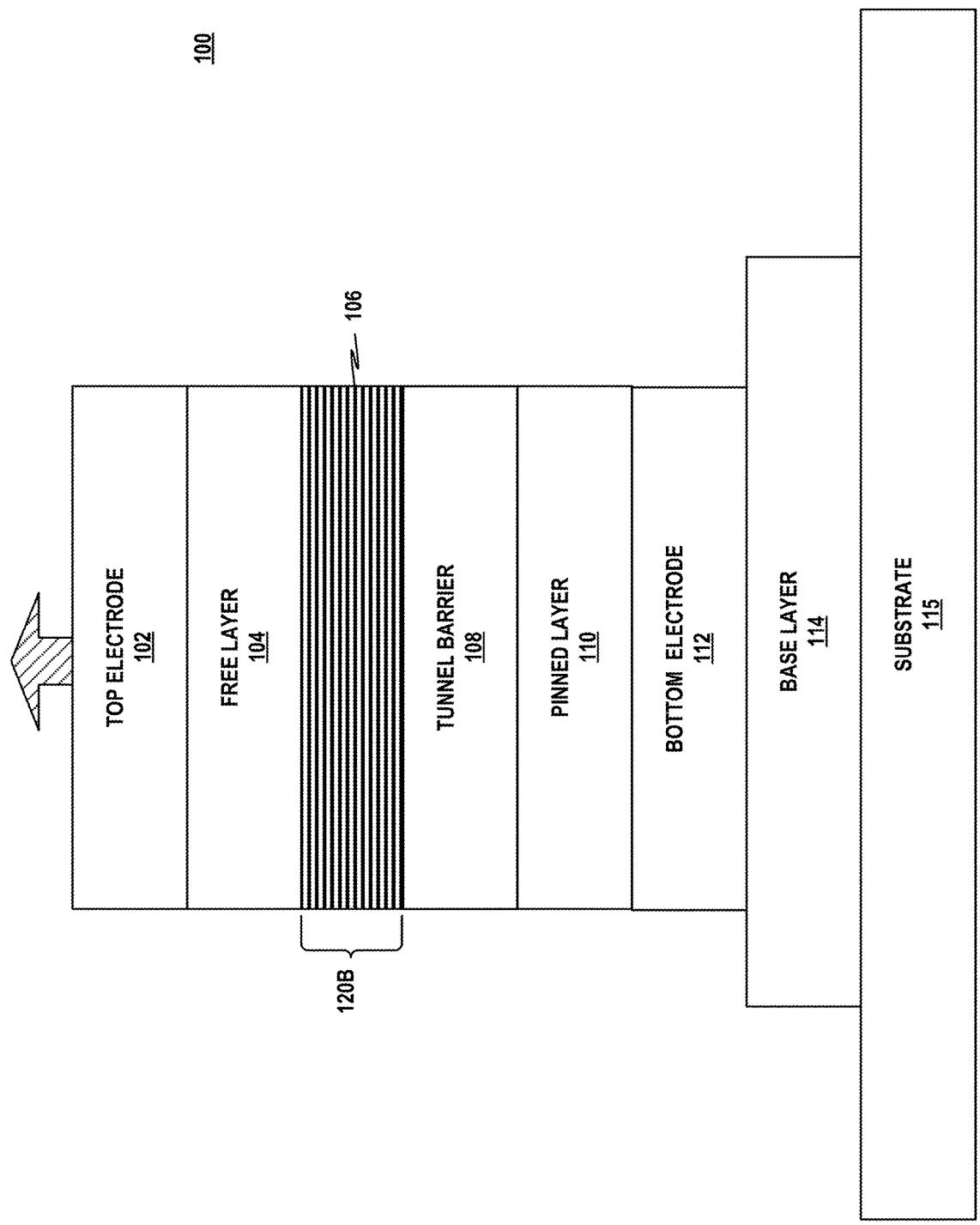
FIG. 1B shows a conceptual illustration of the first MTJ element of FIG. 1A during tensional stress caused by vibrations and mechanical shock.

FIG. 1B shows a conceptual illustration of first MTJ element 100 of FIG. 1A during tensional stress caused by vibrations and mechanical shock. As shown, in response to the tensional stress, elastic layer 106 has a thickness 120B, which is greater than thickness 120A. As such, processing circuitry may detect an increase in a resistance and/or magnetoresistance of MTJ element 100.

Figure 1C:
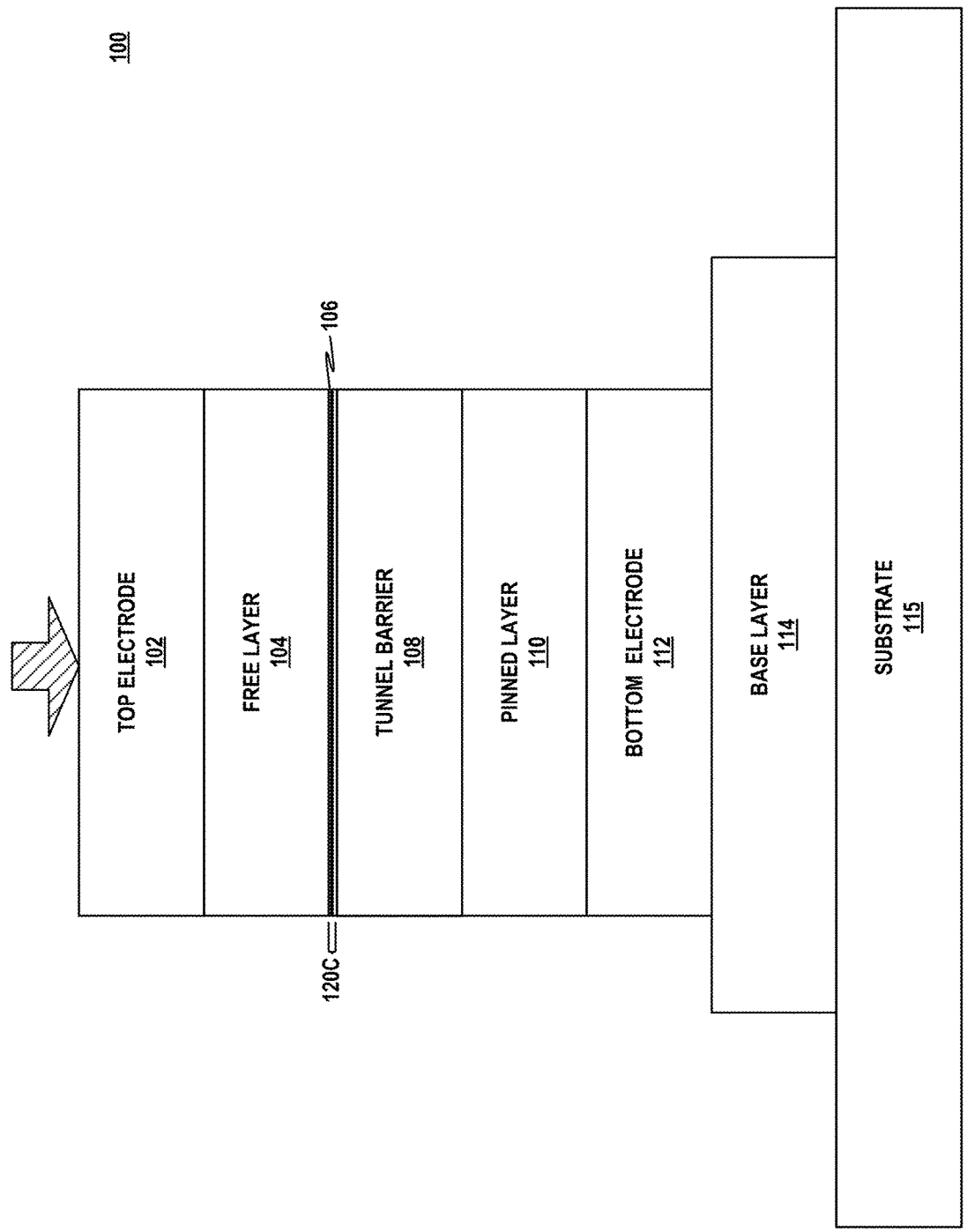
FIG. 1C shows a conceptual illustration of the first MTJ element of FIG. 1A during compressional stress caused by vibrations and mechanical shock.

FIG. 1C shows a conceptual illustration of first MTJ element 100 of FIG. 1A during compressional stress caused by vibrations and mechanical shock. As shown, in response to the compressional stress, elastic layer 106 has a thickness 120C, which is less than thickness 120A. As such, processing circuitry may detect a decrease in a resistance and/or magnetoresistance of MTJ element 100.

Figure 2:
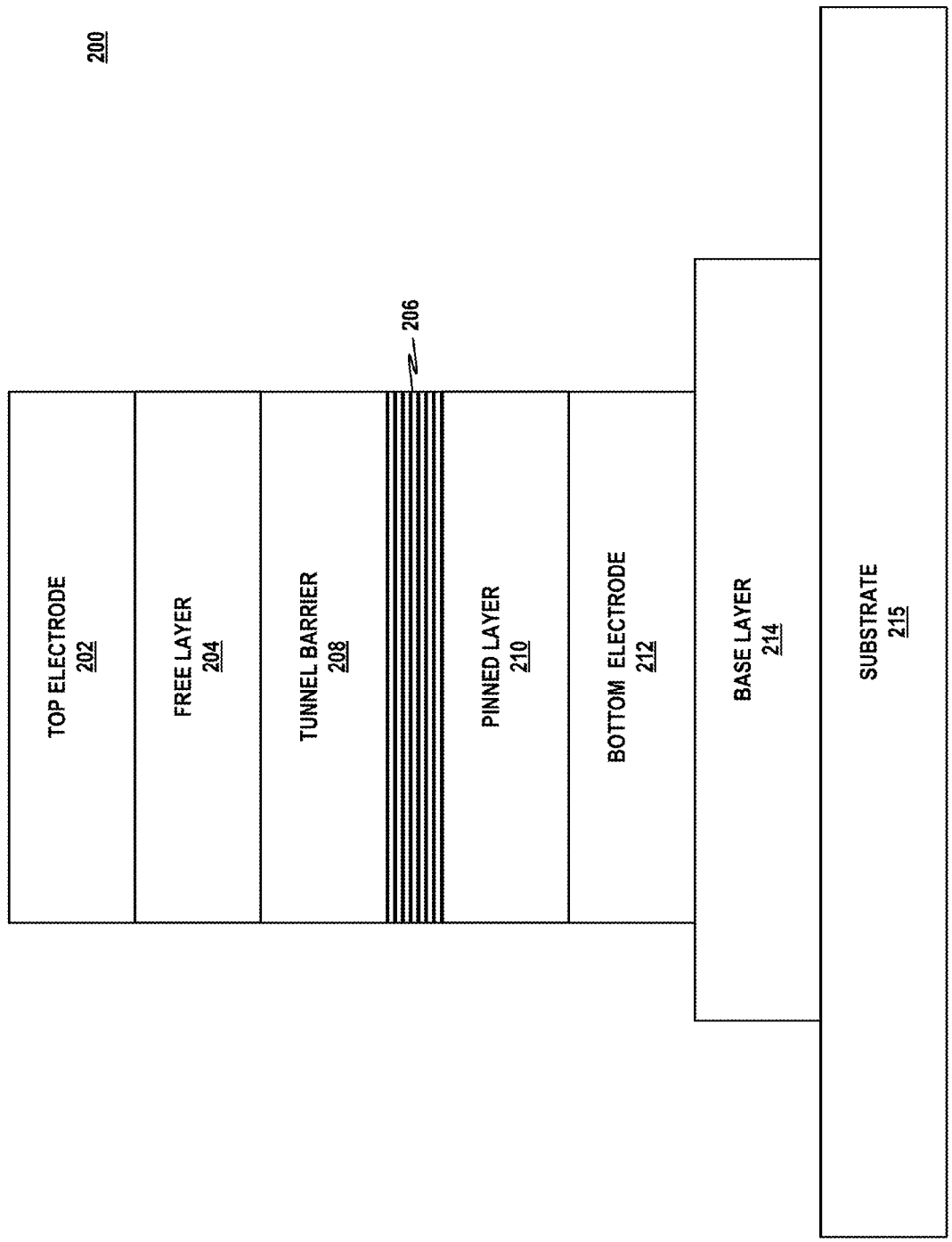
FIG. 2 shows a conceptual illustration of a second MTJ element configured to detect vibrations and mechanical shock.

FIG. 2 shows a conceptual illustration of a second MTJ element 200 configured to detect vibrations and mechanical shock. MTJ element 200 may include top electrode 202, free layer 204, elastic layer 206, tunnel barrier 208, pinned layer 210, bottom electrode 212, base layer 214, and substrate 215, which may be examples of top electrode 102, free layer 104, elastic layer 106, tunnel barrier 108, pinned layer 110, bottom electrode 112, base layer 114, and substrate 115 of FIG. 1A, respectively. In the example of FIG. 2, elastic layer 206 is arranged between tunnel barrier 208 and pinned layer 210. Said differently, for example, tunnel barrier 208 may be spaced apart from pinned layer 210 by elastic layer 206.

Figure 3:
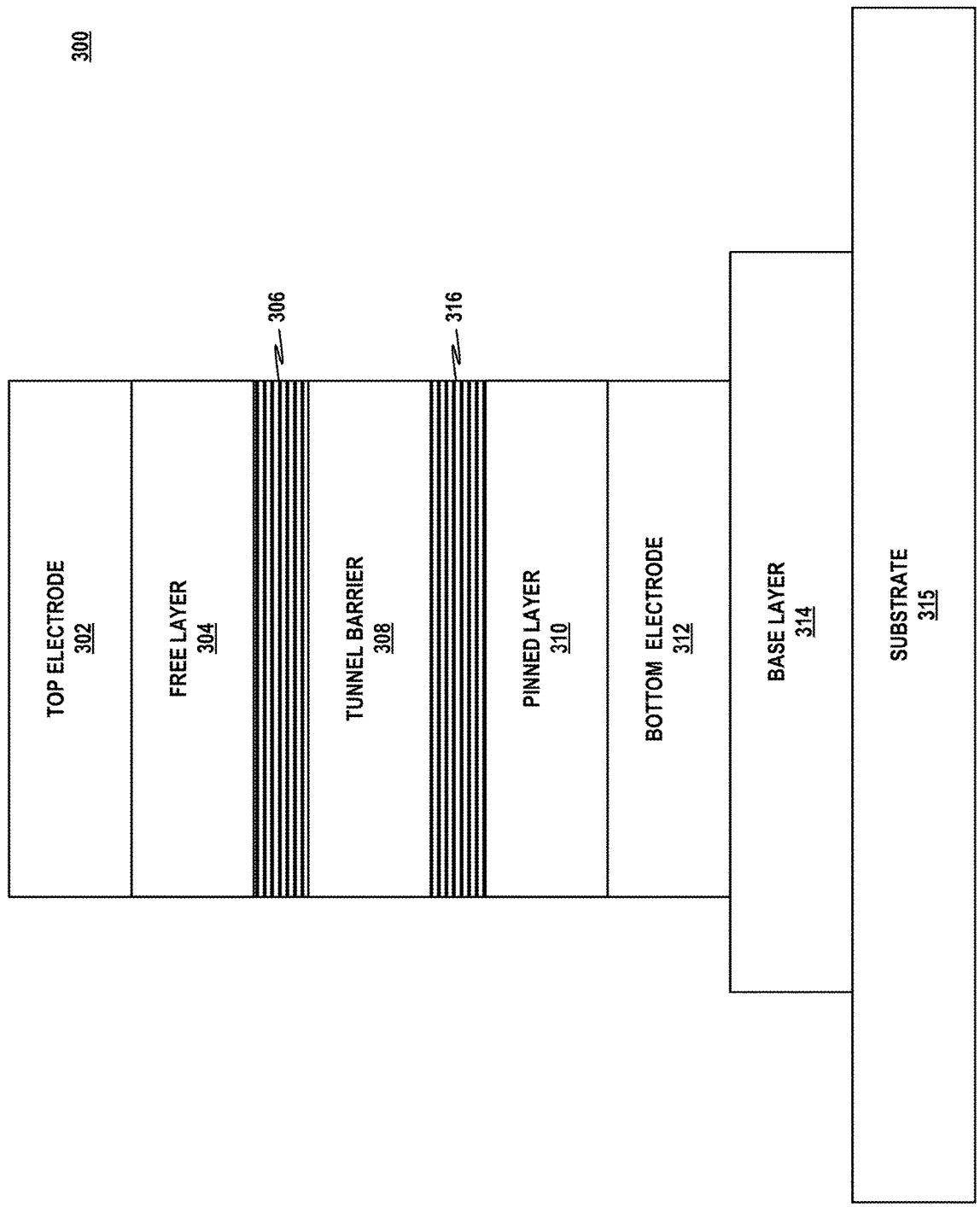
FIG. 3 shows a conceptual illustration of a third MTJ element configured to detect vibrations and mechanical shock.

FIG. 3 shows a conceptual illustration of a third MTJ element 300 configured to detect vibrations and mechanical shock. MTJ element 300 may include top electrode 302, free layer 304, elastic layer 306, tunnel barrier 308, pinned layer 310, bottom electrode 312, base layer 314, and substrate 315, which may be examples of top electrode 102, free layer 104, elastic layer 106, tunnel barrier 108, pinned layer 110, bottom electrode 112, base layer 114, and substrate 115 of FIG. 1, respectively. In the example of FIG. 3, elastic layer 306 is arranged between free layer 304 and tunnel barrier 208. In the example of FIG. 3, MTJ element 300 may further comprise elastic layer 316, which may be substantially similar to elastic layer 306. As shown, elastic layer 316 is arranged between tunnel barrier 308 and pinned layer 310. Said differently, for example, free layer 304 may be spaced apart from tunnel barrier 308 by elastic layer 306 (e.g., a first elastic layer) and tunnel barrier 308 may be spaced apart from pinned layer 310 by elastic layer 316 (e.g., a second elastic layer).

Figure 4:
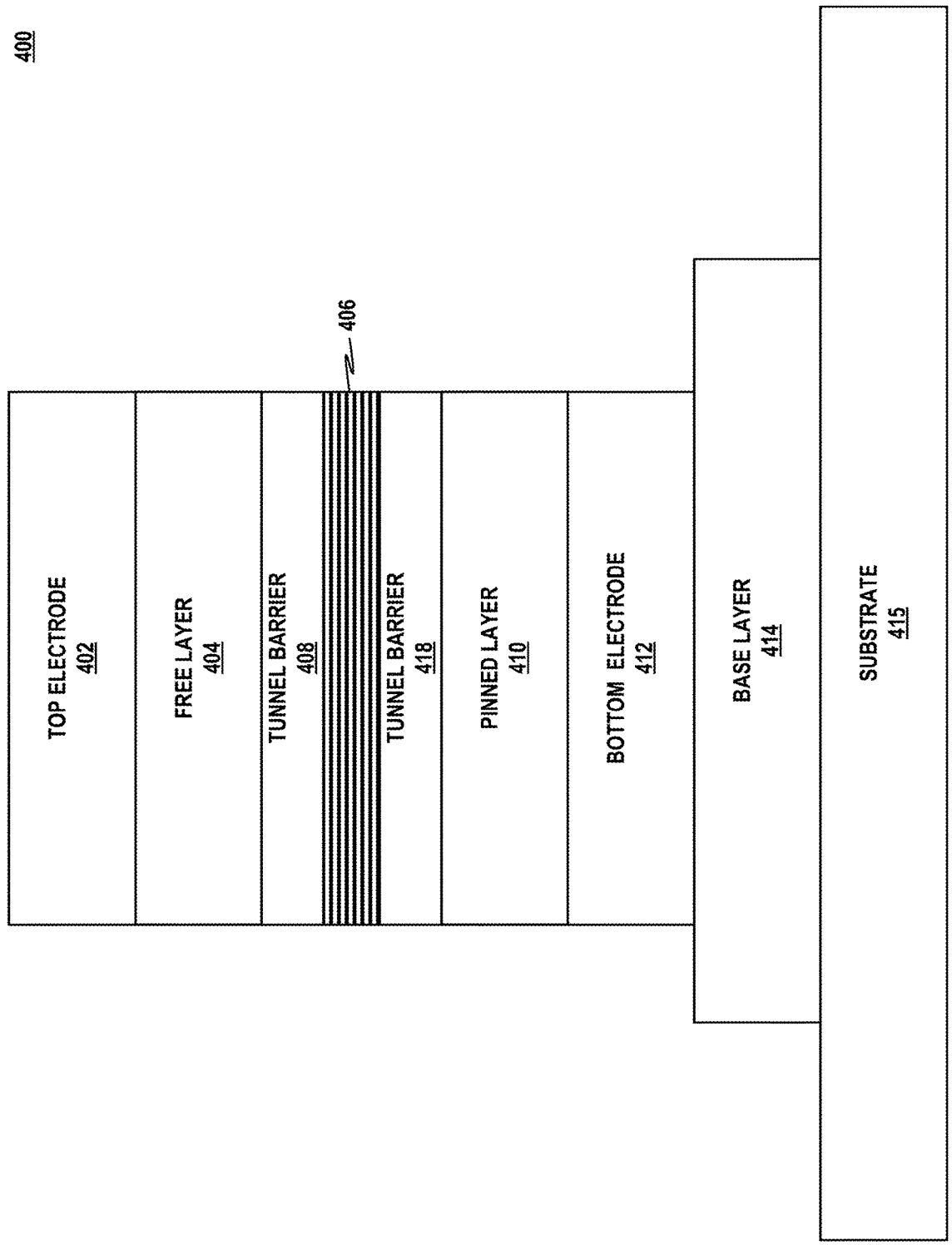
FIG. 4 shows a conceptual illustration of a fourth MTJ element configured to detect vibrations and mechanical shock.

FIG. 4 shows a conceptual illustration of a fourth MTJ element 400 configured to detect vibrations and mechanical shock. MTJ element 400 may include top electrode 402, free layer 404, elastic layer 406, tunnel barrier 408, pinned layer 410, bottom electrode 412, base layer 414, and substrate 415, which may be examples of top electrode 102, free layer 104, elastic layer 106, tunnel barrier 108, pinned layer 110, bottom electrode 112, base layer 114, and substrate 115 of FIG. 1, respectively. The example of FIG. 4 further includes tunnel barrier 418, which may be substantially similar to tunnel barrier 408. In this example, elastic layer 406 is arranged between tunnel barrier 408 and tunnel barrier 418. Said differently, for example, free layer 404 may be spaced apart from elastic layer 406 by tunnel barrier 408 (e.g., a first tunnel barrier), and elastic layer 406 may be spaced apart from pinned layer 410 by tunnel barrier 418 (e.g., a second tunnel barrier).

Figure 5:
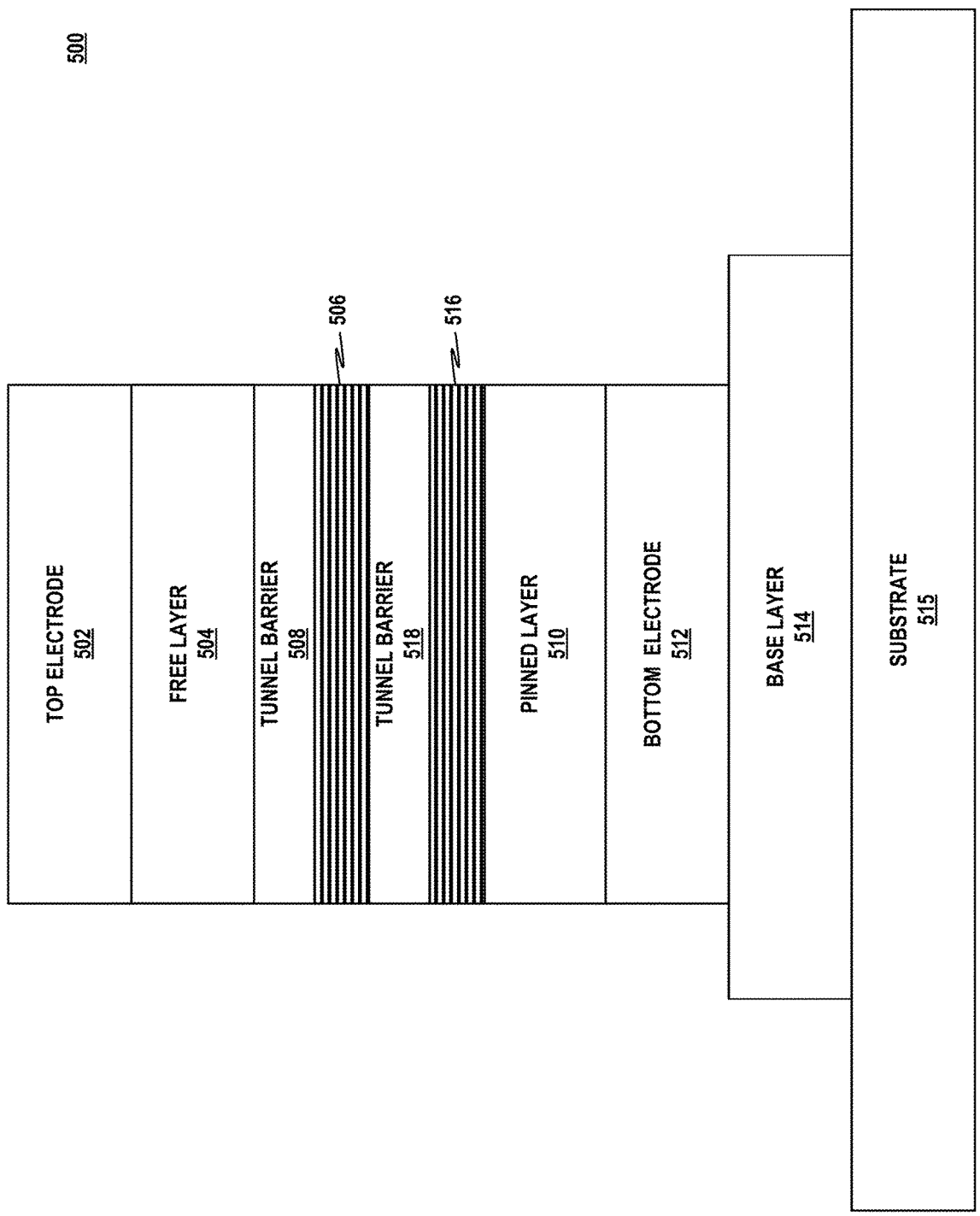
FIG. 5 shows a conceptual illustration of a fifth MTJ element configured to detect vibrations and mechanical shock.

FIG. 5 shows a conceptual illustration of a fifth MTJ element 500 configured to detect vibrations and mechanical shock. MTJ element 500 may include top electrode 502, free layer 504, elastic layer 506, tunnel barrier 508, pinned layer 510, bottom electrode 512, base layer 514, and substrate 515, which may be examples of top electrode 102, free layer 104, elastic layer 106, tunnel barrier 108, pinned layer 110, bottom electrode 112, base layer 114, and substrate 115 of FIG. 1, respectively. The example of FIG. 5 further includes elastic layer 516, which may be substantially similar to elastic layer 506, and tunnel barrier 518, which may be substantially similar to tunnel barrier 508. In this example, elastic layer 506 is arranged between tunnel barrier 508 and tunnel barrier 518 and elastic layer 516 is arranged between tunnel barrier 518 and pinned layer 510. Said differently, for example, free layer 504 may be spaced apart from elastic layer 506 (e.g., a first elastic layer) by tunnel barrier 508 (e.g., a first tunnel barrier), elastic layer 506 may be spaced apart from elastic layer 516 (e.g., a second elastic layer) by tunnel barrier 518 (e.g., a second tunnel barrier), and tunnel barrier 518 may be spaced apart from pinned layer 510 by elastic layer 516.

Figure 6:
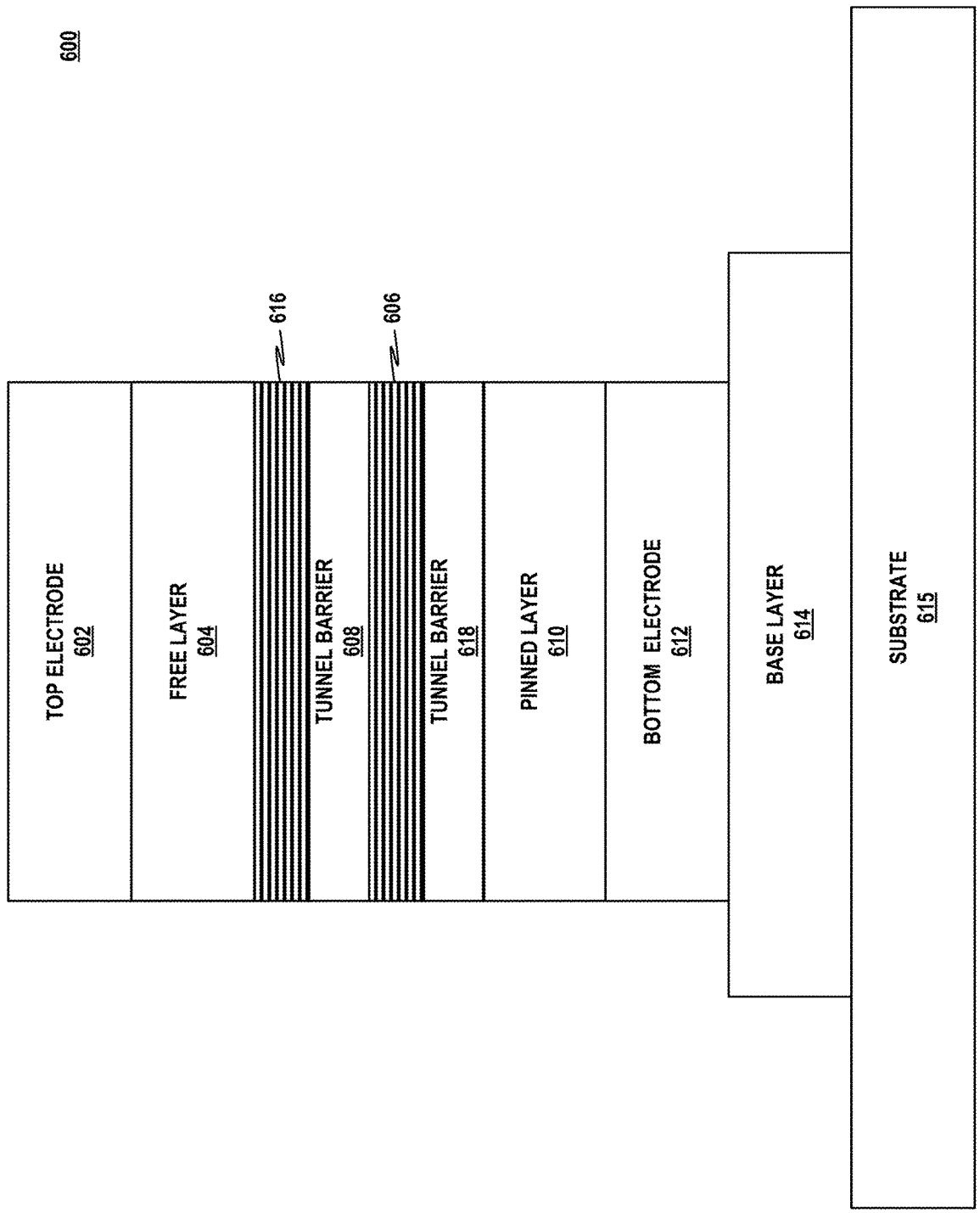
FIG. 6 shows a conceptual illustration of a sixth MTJ element configured to detect vibrations and mechanical shock.

FIG. 6 shows a conceptual illustration of a sixth MTJ element 600 configured to detect vibrations and mechanical shock. MTJ element 600 may include top electrode 602, free layer 604, elastic layer 606, tunnel barrier 608, pinned layer 610, bottom electrode 612, base layer 614, and substrate 615, which may be examples of top electrode 102, free layer 104, elastic layer 106, tunnel barrier 108, pinned layer 110, bottom electrode 112, base layer 114, and substrate 115 of FIG. 1, respectively. The example of FIG. 6 further includes elastic layer 616, which may be substantially similar to elastic layer 606, and tunnel barrier 618, which may be substantially similar to tunnel barrier 608. In this example, elastic layer 606 is arranged between tunnel barrier 608 and tunnel barrier 618 and elastic layer 616 is arranged between free layer 604 and tunnel barrier 608. Said differently, for example, free layer 604 may be spaced apart from tunnel barrier 608 (e.g., a first tunnel barrier) by elastic layer 616 (e.g., a first elastic layer), tunnel barrier 608 may be spaced apart from tunnel barrier 618 (e.g., a second tunnel barrier) by elastic layer 606 (e.g., a second elastic layer), and elastic layer 606 is spaced apart from pinned layer 610 by second tunnel barrier 618.

Figure 7:
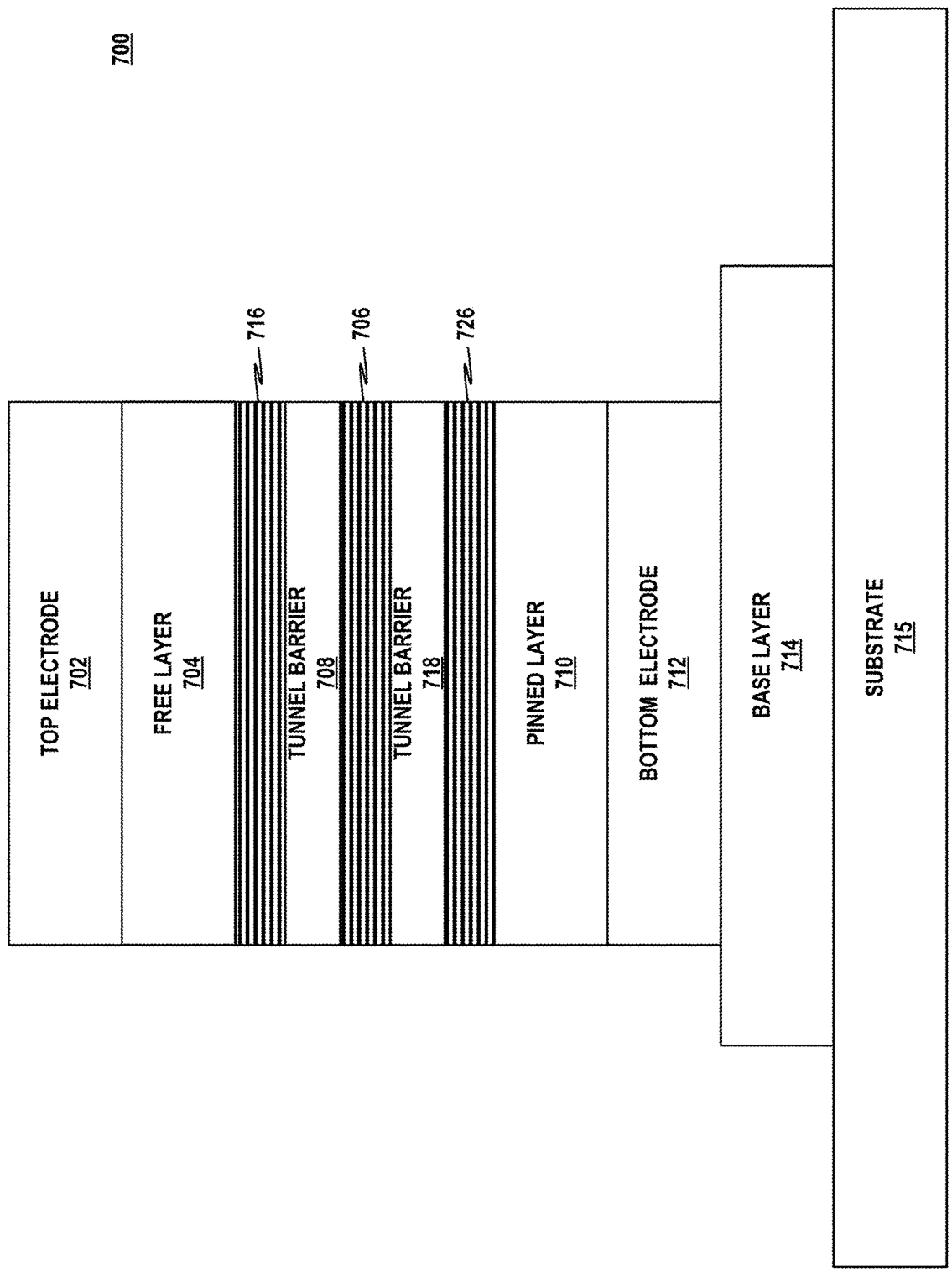
FIG. 7 shows a conceptual illustration of a seventh MTJ element configured to detect vibrations and mechanical shock.

FIG. 7 shows a conceptual illustration of a seventh MTJ element 700 configured to detect vibrations and mechanical shock. MTJ element 700 may include top electrode 702, free layer 704, elastic layer 706, tunnel barrier 708, pinned layer 710, bottom electrode 712, base layer 714, and substrate 715, which may be examples of top electrode 102, free layer 104, elastic layer 106, tunnel barrier 108, pinned layer 110, bottom electrode 112, base layer 114, and substrate 115 of FIG. 1, respectively. The example of FIG. 7 further includes elastic layer 716, which may be substantially similar to elastic layer 706, elastic layer 726, which may be substantially similar to elastic layer 706, and tunnel barrier 718, which may be substantially similar to tunnel barrier 708. In this example, elastic layer 706 is arranged between tunnel barrier 708 and tunnel barrier 718, elastic layer 716 is arranged between free layer 704 and tunnel barrier 708, and elastic layer 726 is arranged between tunnel barrier 718 and pinned layer 710. Said differently, for example, free layer 704 may be spaced apart from tunnel barrier 708 (e.g., a first tunnel barrier) by elastic layer 716 (e.g., a first elastic layer), tunnel barrier 708 may be spaced apart from tunnel barrier 718 (e.g., a second tunnel barrier) by elastic layer 706 (e.g., a second elastic layer), and tunnel barrier 718 may be spaced apart from pinned layer 710 by elastic layer 726 (e.g., a third elastic layer).

Figure 8:
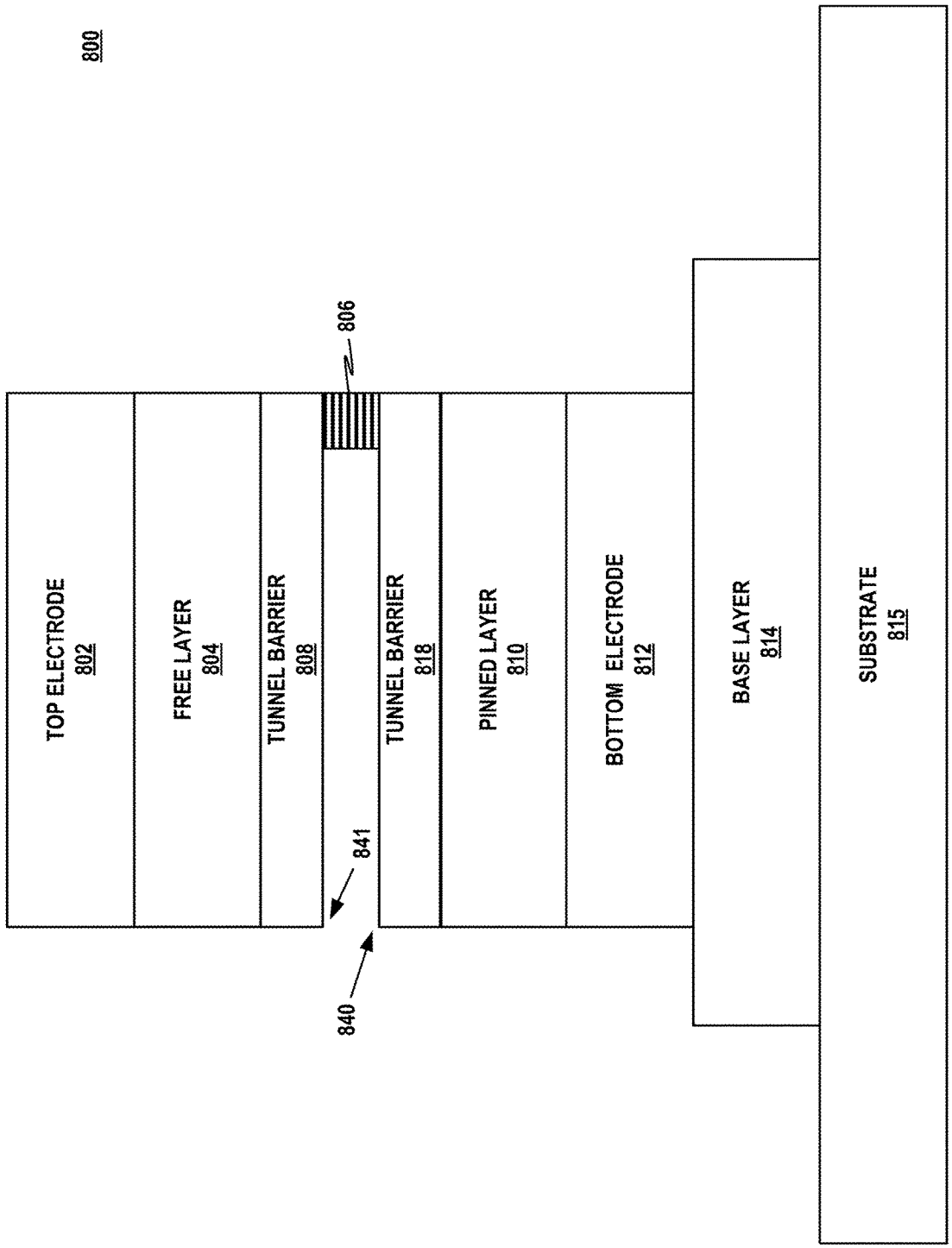
FIG. 8 shows a conceptual illustration of an eight MTJ element configured to detect vibrations and mechanical shock.

FIG. 8 shows a conceptual illustration of an eight MTJ element 800 configured to detect vibrations and mechanical shock. MTJ element 800 may include top electrode 802, free layer 804, elastic layer 806, tunnel barrier 808, pinned layer 810, bottom electrode 812, base layer 814, and substrate 815, which may be examples of top electrode 102, free layer 104, elastic layer 106, tunnel barrier 108, pinned layer 110, bottom electrode 112, base layer 114, and substrate 115 of FIG. 1, respectively. The example of FIG. 8 further includes tunnel barrier 818, which may be substantially similar to tunnel barrier 808. In this example, elastic layer 806 is arranged between tunnel barrier 808 and tunnel barrier 818. As shown, elastic layer 806 is spaced apart from edge 840 of tunnel barrier 818.

In the example of FIG. 8, elastic layer 806 comprises a thin spacer configured to allow modulation of tunneling current in response to shock and/or vibration. Elastic layer 806 may be deposited before depositing and/or oxidation of material for tunnel barrier 808 and/or tunnel barrier 818. Alternatively, elastic layer 806 may be deposited after depositing and/or oxidation of material for tunnel barrier 808 and/or tunnel barrier 818. Elastic layer 806 may be etched using a sacrificial layer. Examples of a sacrificial layer may include, but are not limited to, an oxide such as silicon oxide and/or Tetraethyl orthosilicate (TEOS) system or other material, such as silicon nitride, with controllable/selective etch rate. Polymeric materials are also candidate materials. In some examples, forming MTJ element 800 may include one or more of a complete MTJ deposition, MTJ etch, and/or a selective etch.

Elastic layer 806 may be arranged relative to tunnel barrier 808 and tunnel barrier 818 according to one or more design parameters. For example, a human being may arrange elastic layer 806 relative to edge 841 (e.g., a left edge) of the lower surface of tunnel barrier 808 and/or to edge 840 (e.g., a left edge) of the upper surface of tunnel barrier 818 using various factors, for example, but not limited to, an expected level of shock, an expected frequency of shock, a frequency range of shock, a sensitivity level, or another factor. For instance, a human being may arrange elastic layer 806 relative to edge 841 and/or edge 840 for a low shock application. Additionally, or alternatively, a human being may select a thickness and/or a width of elastic layer 806 according to one or more design parameters.

As shown, in the example of FIG. 8, tunnel barrier 808 (e.g., a first tunnel barrier) is spaced apart from tunnel barrier 818 (e.g., a second tunnel barrier) by elastic layer 806. In this example, elastic layer 806 is arranged below a lower surface of tunnel barrier 808 and spaced apart from edge 841 (e.g., a left edge) of the lower surface of tunnel barrier 808 and elastic layer 806 is arranged above an upper surface of tunnel barrier 818 and spaced apart from edge 840 (e.g., a left edge) of the upper surface of tunnel barrier 818.

Figure 9:
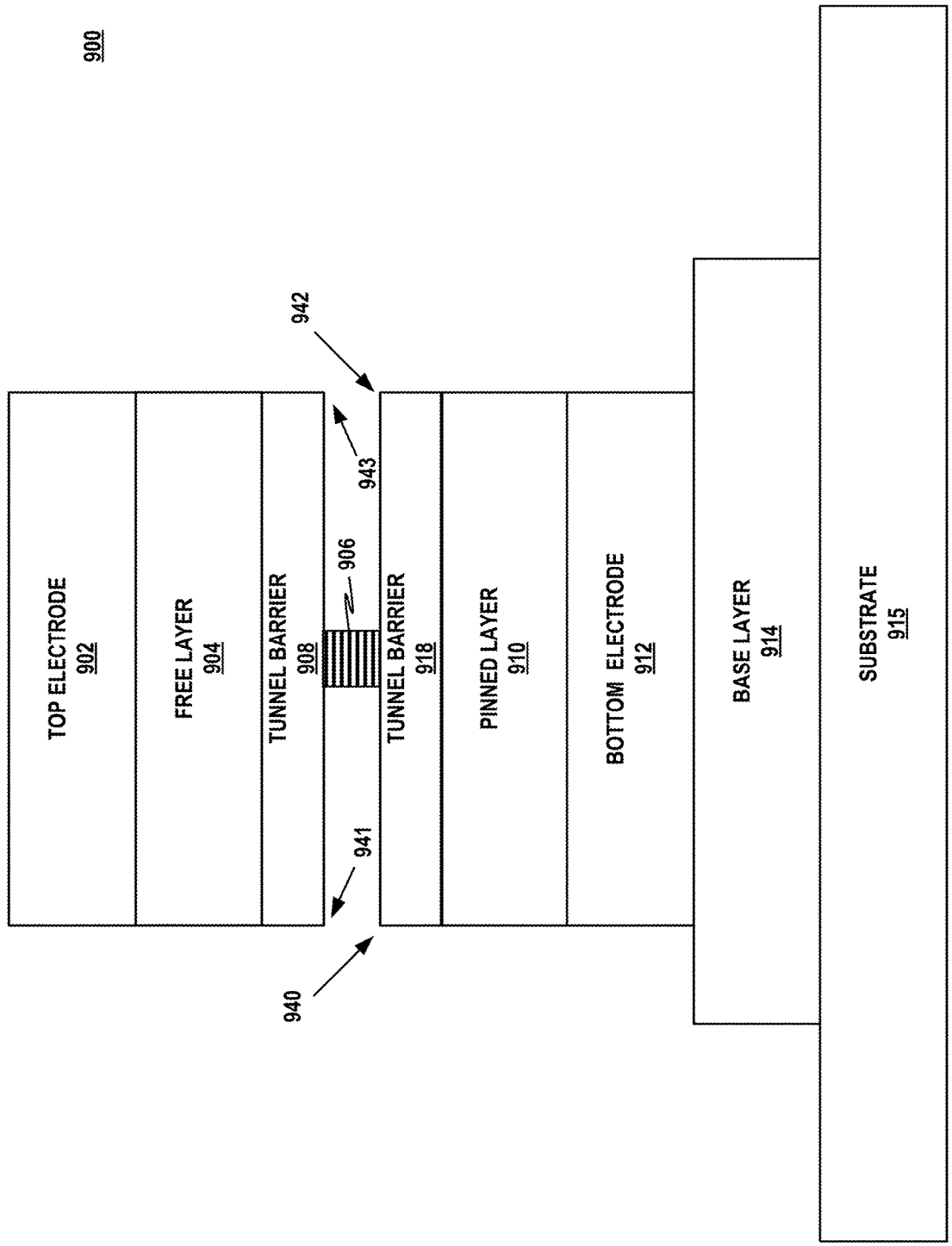
FIG. 9 shows a conceptual illustration of a ninth MTJ element configured to detect vibrations and mechanical shock.

FIG. 9 shows a conceptual illustration of a ninth MTJ element 900 configured to detect vibrations and mechanical shock. MTJ element 900 may include top electrode 902, free layer 904, elastic layer 906, tunnel barrier 908, pinned layer 910, bottom electrode 912, base layer 914, and substrate 915, which may be examples of top electrode 102, free layer 104, elastic layer 106, tunnel barrier 108, pinned layer 110, bottom electrode 112, base layer 114, and substrate 115 of FIG. 1, respectively. The example of FIG. 9 further includes tunnel barrier 918, which may be substantially similar to tunnel barrier 908. In this example, elastic layer 906 is arranged between tunnel barrier 908 and tunnel barrier 918. In the example of FIG. 9, elastic layer 906 comprises a thin spacer configured to allow modulation of tunneling current in response to shock and/or vibration. As shown, elastic layer 906 is spaced apart from edge 940 of tunnel barrier 918 and edge 942 of tunnel barrier 918.

In the example of FIG. 9, tunnel barrier 908 (e.g., a first tunnel barrier) is spaced apart from tunnel barrier 918 (e.g., a second tunnel barrier) by elastic layer 906. In this example, elastic layer 906 is arranged below a lower surface of tunnel barrier 908 and spaced apart from edge 941 (e.g., a left edge) and edge 943 (e.g., a right edge) of the lower surface of tunnel barrier 908 and elastic layer 906 is arranged above an upper surface of tunnel barrier 918 and spaced apart from edge 940 (e.g., a left edge) and edge 942 (e.g., a left edge) of the upper surface of tunnel barrier 918.

Figure 10:
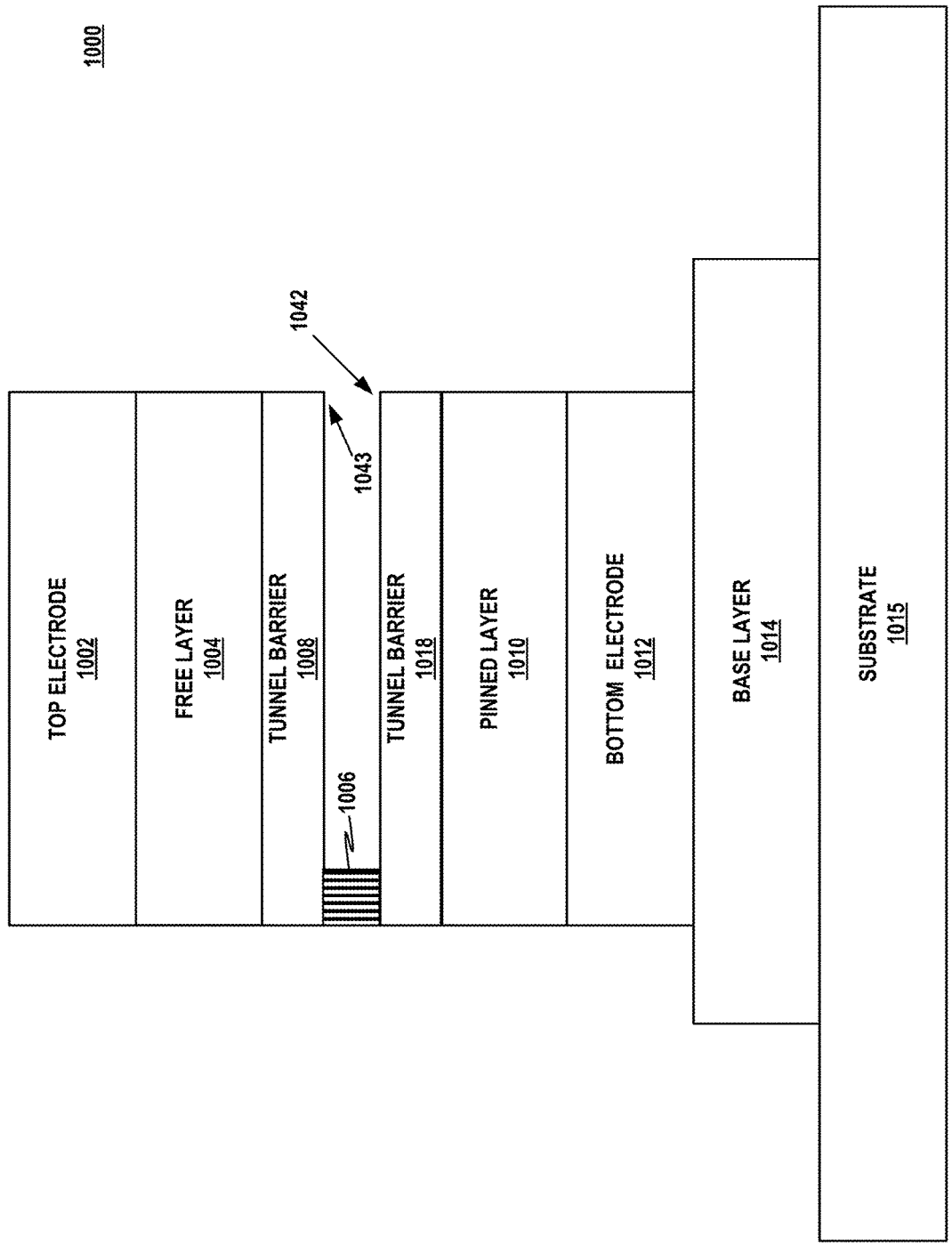
FIG. 10 shows a conceptual illustration of a tenth MTJ element configured to detect vibrations and mechanical shock.

FIG. 10 shows a conceptual illustration of a tenth MTJ element 1000 configured to detect vibrations and mechanical shock. MTJ element 1000 may include top electrode 1002, free layer 1004, elastic layer 1006, tunnel barrier 1008, pinned layer 1010, bottom electrode 1012, base layer 1014, and substrate 1015, which may be examples of top electrode 102, free layer 104, elastic layer 106, tunnel barrier 108, pinned layer 110, bottom electrode 112, base layer 114, and substrate 115 of FIG. 1, respectively. The example of FIG. 10 further includes tunnel barrier 1018, which may be substantially similar to tunnel barrier 1008. In this example, elastic layer 1006 is arranged between tunnel barrier 1008 and tunnel barrier 1018. In the example of FIG. 10, elastic layer 1006 comprises a thin spacer configured to allow modulation of tunneling current in response to shock and/or vibration. As shown, elastic layer 1006 is spaced apart from edge 1042 of tunnel barrier 1018.

In the example of FIG. 10, tunnel barrier 1008 (e.g., a first tunnel barrier) is spaced apart from tunnel barrier 1018 (e.g., a second tunnel barrier) by elastic layer 1006. In this example, elastic layer 1006 is arranged below a lower surface of tunnel barrier 1008 and spaced apart from edge 1043 (e.g., a right edge) of the lower surface of tunnel barrier 1008 and elastic layer 1006 is arranged above an upper surface of tunnel barrier 1018 and spaced apart from edge 1042 (e.g., a right edge) of the upper surface of tunnel barrier 1018.

Figure 11:
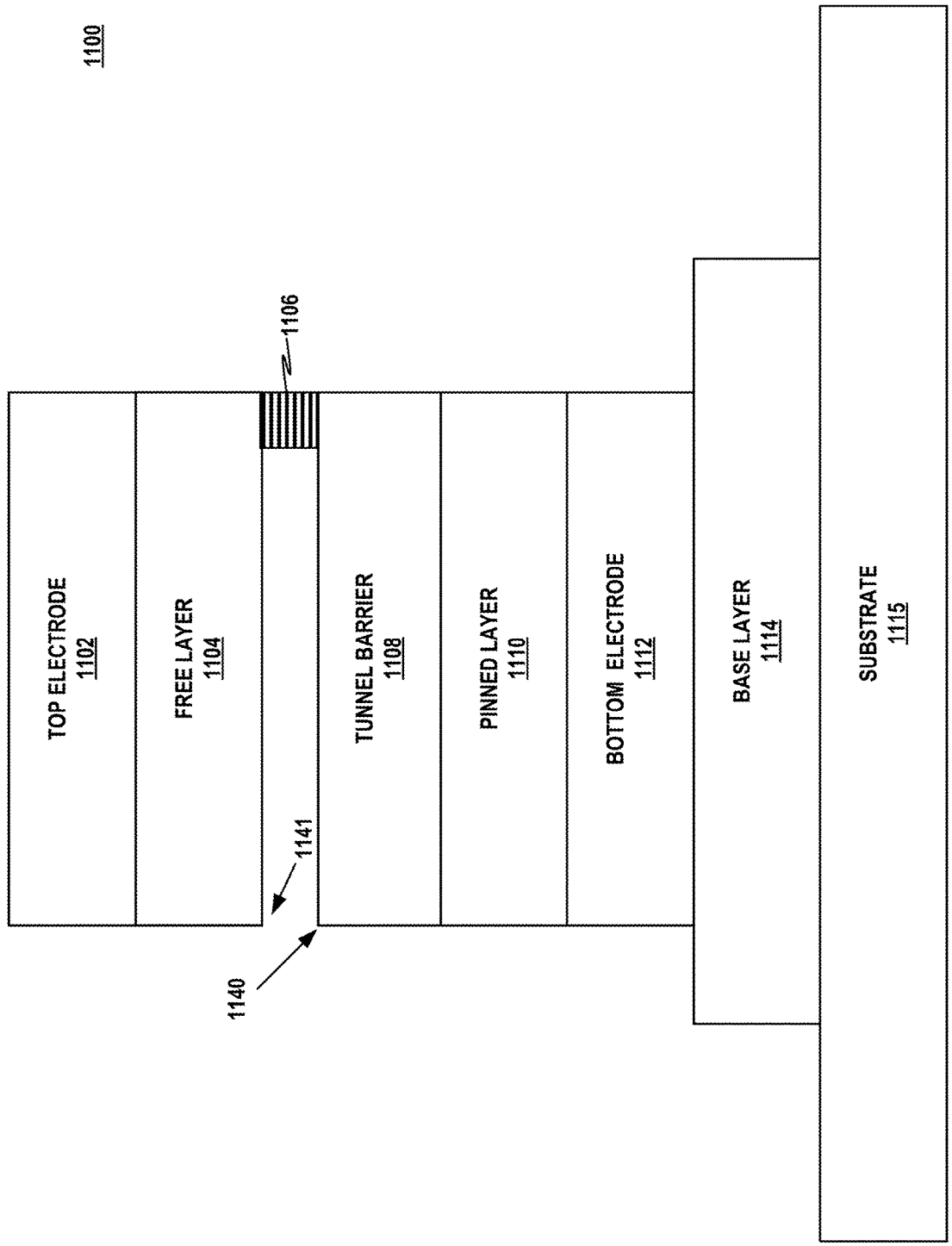
FIG. 11 shows a conceptual illustration of an eleventh MTJ element configured to detect vibrations and mechanical shock.

FIG. 11 shows a conceptual illustration of an eleventh MTJ element 1100 configured to detect vibrations and mechanical shock. MTJ element 1100 may include top electrode 1102, free layer 1104, elastic layer 1106, tunnel barrier 1108, pinned layer 1110, bottom electrode 1112, base layer 1114, and substrate 1115, which may be examples of top electrode 102, free layer 104, elastic layer 106, tunnel barrier 108, pinned layer 110, bottom electrode 112, base layer 114, and substrate 115 of FIG. 1, respectively. In this example, elastic layer 1106 is arranged between free layer 1104 and tunnel barrier 1108. In the example of FIG. 11, elastic layer 1106 comprises a thin spacer configured to allow modulation of tunneling current in response to shock and/or vibration. As shown, elastic layer 1106 is spaced apart from edge 1140 of tunnel barrier 1108.

In the example of FIG. 11, free layer 1104 is spaced apart from tunnel barrier 1108 by elastic layer 1106. In this example, elastic layer 1106 is arranged below a lower surface of free layer 1104 and spaced apart from edge 1141 (e.g., a left edge) of the lower surface of free layer 1104, and elastic layer 1106 is arranged above an upper surface of tunnel barrier 1108 and spaced apart from edge 1140 (e.g., a left edge) of the upper surface of tunnel barrier 1108.

Figure 12:
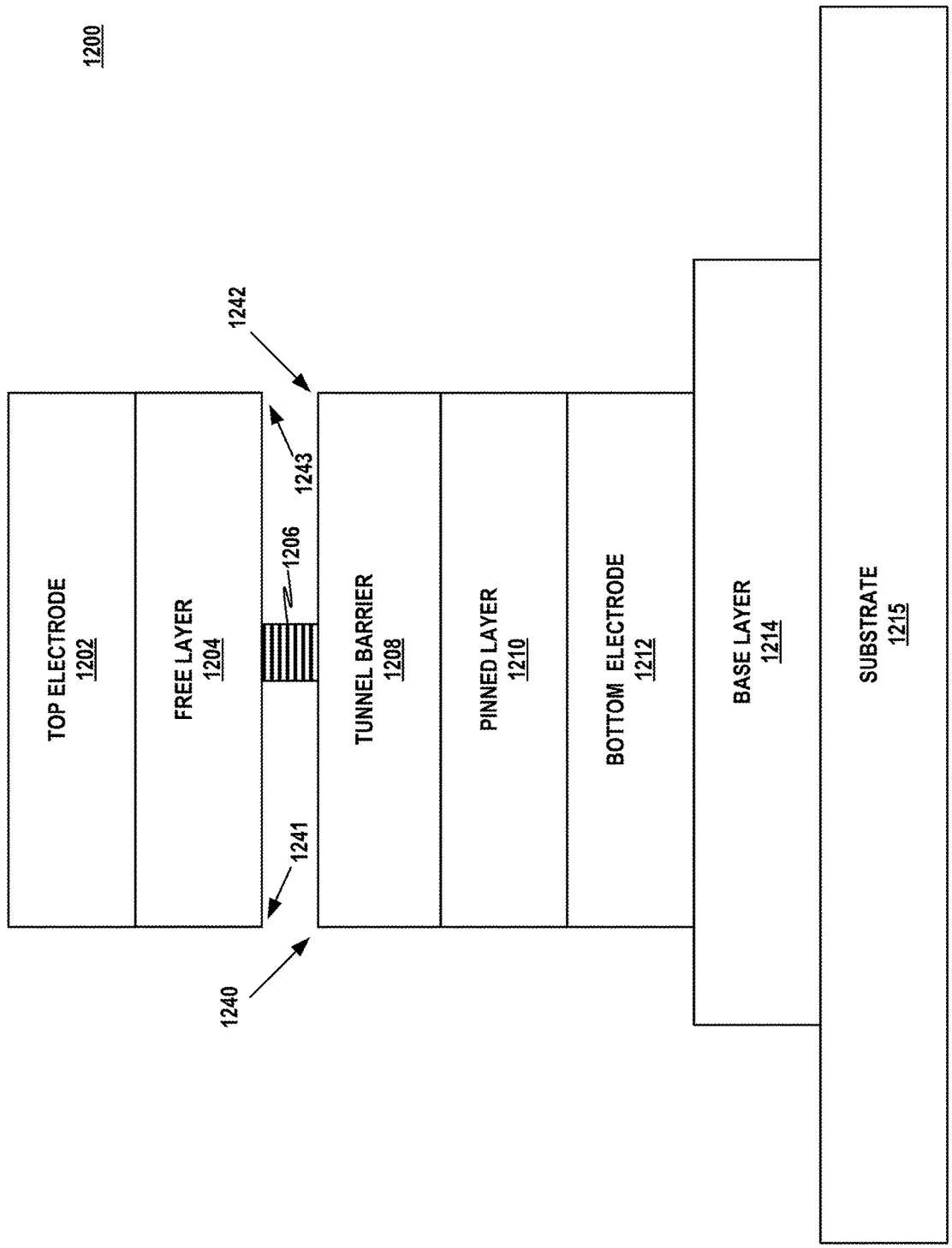
FIG. 12 shows a conceptual illustration of a twelfth MTJ element configured to detect vibrations and mechanical shock.

FIG. 12 shows a conceptual illustration of a twelfth MTJ element 1200 configured to detect vibrations and mechanical shock. MTJ element 1200 may include top electrode 1202, free layer 1204, elastic layer 1206, tunnel barrier 1208, pinned layer 1210, bottom electrode 1212, base layer 1214, and substrate 1215, which may be examples of top electrode 102, free layer 104, elastic layer 106, tunnel barrier 108, pinned layer 110, bottom electrode 112, base layer 114, and substrate 115 of FIG. 1, respectively. In this example, elastic layer 1206 is arranged between free layer 1204 and tunnel barrier 1208. In the example of FIG. 12, elastic layer 1206 comprises a thin spacer configured to allow modulation of tunneling current in response to shock and/or vibration. As shown, elastic layer 1206 is spaced apart from edge 1240 of tunnel barrier 1208 and edge 1242 of tunnel barrier 1208.

In the example of FIG. 12, free layer 1204 is spaced apart from tunnel barrier 1208 by elastic layer 1206. In this example, elastic layer 1206 is arranged below a lower surface of free layer 1204 and spaced apart from edge 1241 (e.g., a left edge) and edge 1243 (e.g., a right edge) of the lower surface of free layer 1204, and elastic layer 1206 is arranged above an upper surface of tunnel barrier 1208 and spaced apart from edge 1240 (e.g., a left edge) and edge 1242 (e.g., a right edge) of the upper surface of tunnel barrier 1208.

Figure 13:
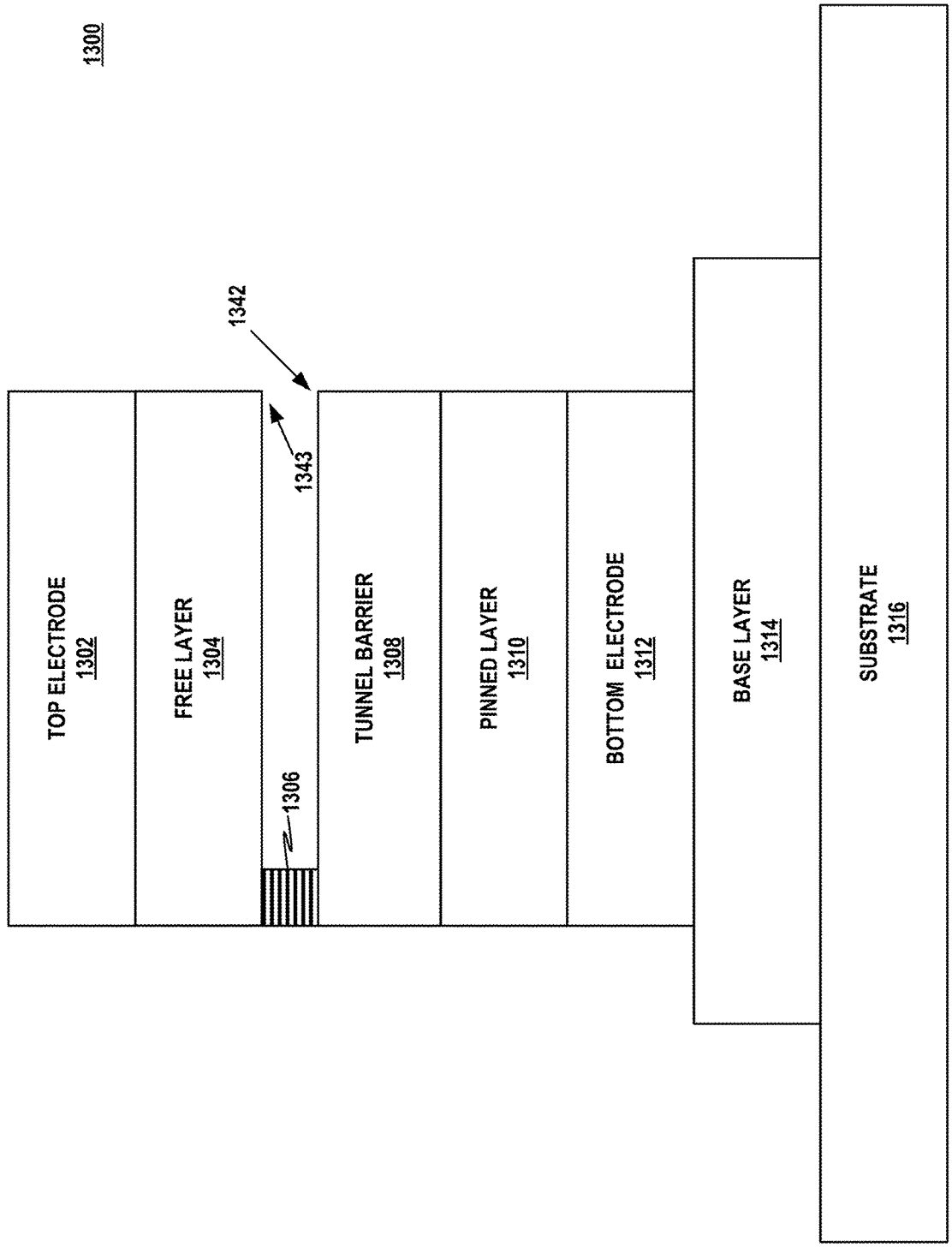
FIG. 13 shows a conceptual illustration of a thirteenth MTJ element configured to detect vibrations and mechanical shock.

FIG. 13 shows a conceptual illustration of a thirteenth MTJ element 1300 configured to detect vibrations and mechanical shock. MTJ element 1300 may include top electrode 1302, free layer 1304, elastic layer 1306, tunnel barrier 1308, pinned layer 1310, bottom electrode 1312, base layer 1314, and substrate 1315, which may be examples of top electrode 102, free layer 104, elastic layer 106, tunnel barrier 108, pinned layer 110, bottom electrode 112, base layer 114, and substrate 115 of FIG. 1, respectively. In this example, elastic layer 1306 is arranged between free layer 1304 and tunnel barrier 1308. In the example of FIG. 13, elastic layer 1306 comprises a thin spacer configured to allow modulation of tunneling current in response to shock and/or vibration. As shown, elastic layer 1306 is spaced apart from edge 1342 of tunnel barrier 1308.

In the example of FIG. 13, free layer 1304 is spaced apart from tunnel barrier 1308 by elastic layer 1306. In this example, elastic layer 1306 is arranged below a lower surface of free layer 1304 and spaced apart from edge 1343 (e.g., a right edge) of the lower surface of free layer 1304, and elastic layer 1306 is arranged above an upper surface of tunnel barrier 1308 and spaced apart from edge 1342 (e.g., a right edge) of the upper surface of tunnel barrier 1308.

Figure 14:
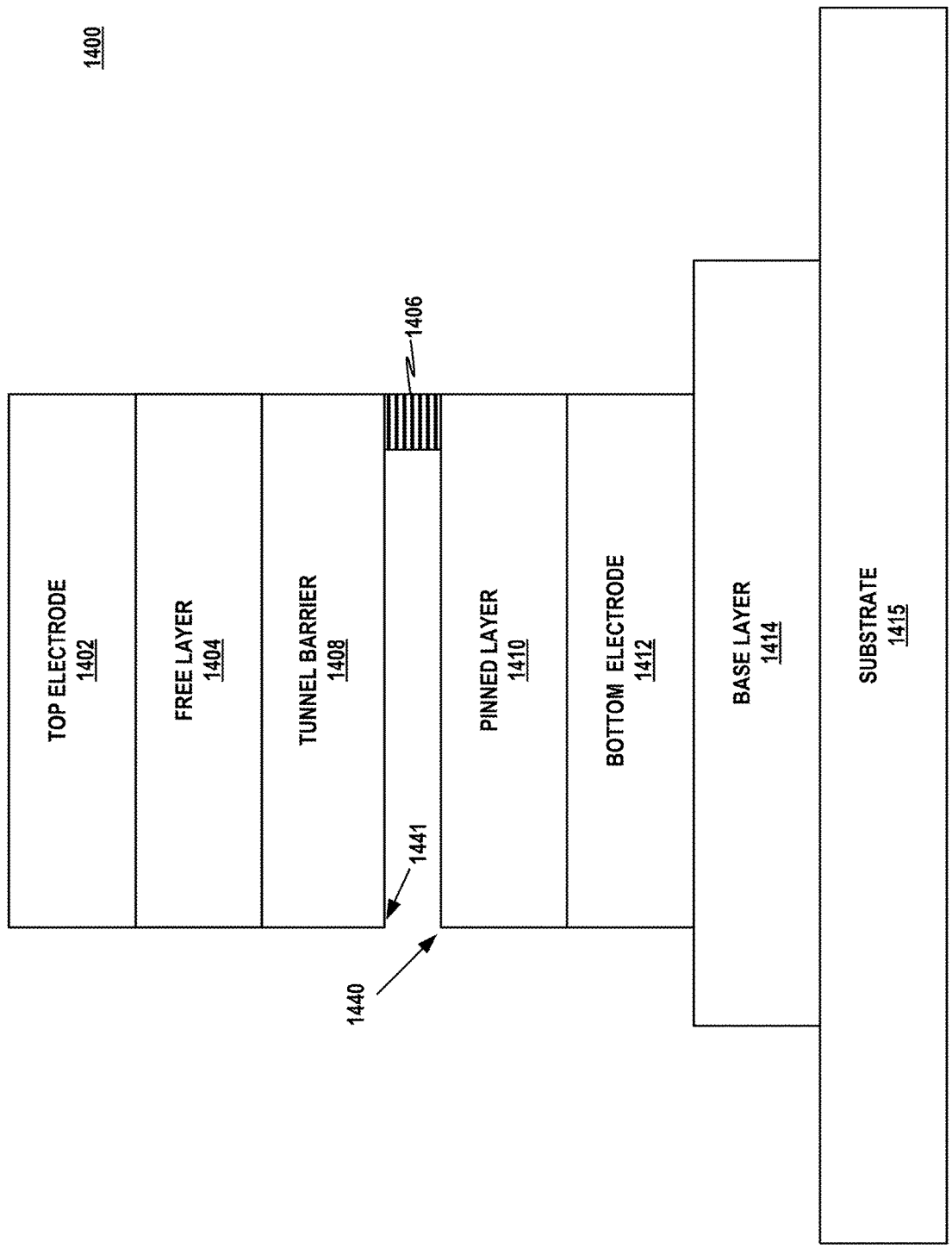
FIG. 14 shows a conceptual illustration of a fourteenth MTJ element configured to detect vibrations and mechanical shock.

FIG. 14 shows a conceptual illustration of a fourteenth MTJ element 1400 configured to detect vibrations and mechanical shock. MTJ element 1400 may include top electrode 1402, free layer 1404, elastic layer 1406, tunnel barrier 1408, pinned layer 1410, bottom electrode 1412, base layer 1414, and substrate 1415, which may be examples of top electrode 102, free layer 104, elastic layer 106, tunnel barrier 108, pinned layer 110, bottom electrode 112, base layer 114, and substrate 115 of FIG. 1, respectively. In this example, elastic layer 1406 is arranged between tunnel barrier 1408 and pinned layer 1410. In the example of FIG. 14, elastic layer 1406 comprises a thin spacer configured to allow modulation of tunneling current in response to shock and/or vibration. As shown, elastic layer 1406 is spaced apart from edge 1440 of pinned layer 1410.

In the example of FIG. 14, tunnel barrier 1408 is spaced apart from pinned layer 1410 by elastic layer 1406. In this example, elastic layer 1406 is arranged below a lower surface of tunnel barrier 1408 and spaced apart from edge 1441 (e.g., a left edge) of the lower surface of tunnel barrier 1408, and elastic layer 1406 is arranged above an upper surface of pinned layer 1410 and spaced apart from edge 1440 (e.g., a left edge) of the upper surface of pinned layer 1410.

Figure 15:
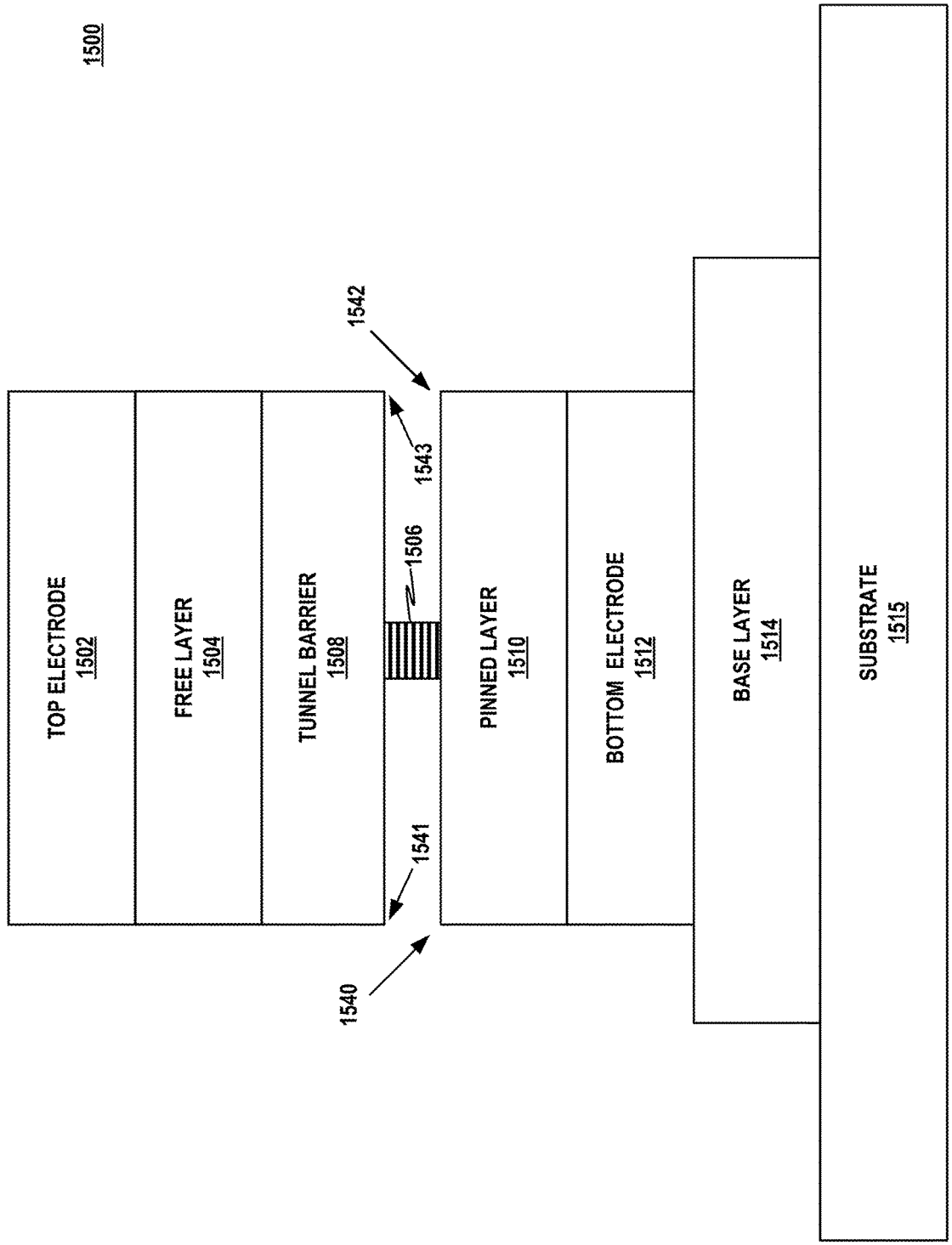
FIG. 15 shows a conceptual illustration of a fifteenth MTJ element configured to detect vibrations and mechanical shock.

FIG. 15 shows a conceptual illustration of a fifteenth MTJ element 1500 configured to detect vibrations and mechanical shock. MTJ element 1500 may include top electrode 1502, free layer 1504, elastic layer 1506, tunnel barrier 1508, pinned layer 1510, bottom electrode 1512, base layer 1514, and substrate 1515, which may be examples of top electrode 102, free layer 104, elastic layer 106, tunnel barrier 108, pinned layer 110, bottom electrode 112, base layer 114, and substrate 115 of FIG. 1, respectively. In this example, elastic layer 1506 is arranged between tunnel barrier 1508 and pinned layer 1510. In the example of FIG. 15, elastic layer 1506 comprises a thin spacer configured to allow modulation of tunneling current in response to shock and/or vibration. As shown, elastic layer 1506 is spaced apart from edge 1540 of pinned layer 1510 and edge 1542 of pinned layer 1510.

In the example of FIG. 15, tunnel barrier 1508 is spaced apart from pinned layer 1510 by elastic layer 1506. In this example, elastic layer 1506 is arranged below a lower surface of tunnel barrier 1508 and spaced apart from edge 1541 (e.g., a left edge) and edge 1543 (e.g., a right edge) of the lower surface of tunnel barrier 1508, and elastic layer 1506 is arranged above an upper surface of pinned layer 1510 and spaced apart from edge 1540 (e.g., a left edge) and edge 1542 (e.g., a right edge) of the upper surface of pinned layer 1510.

Figure 16:
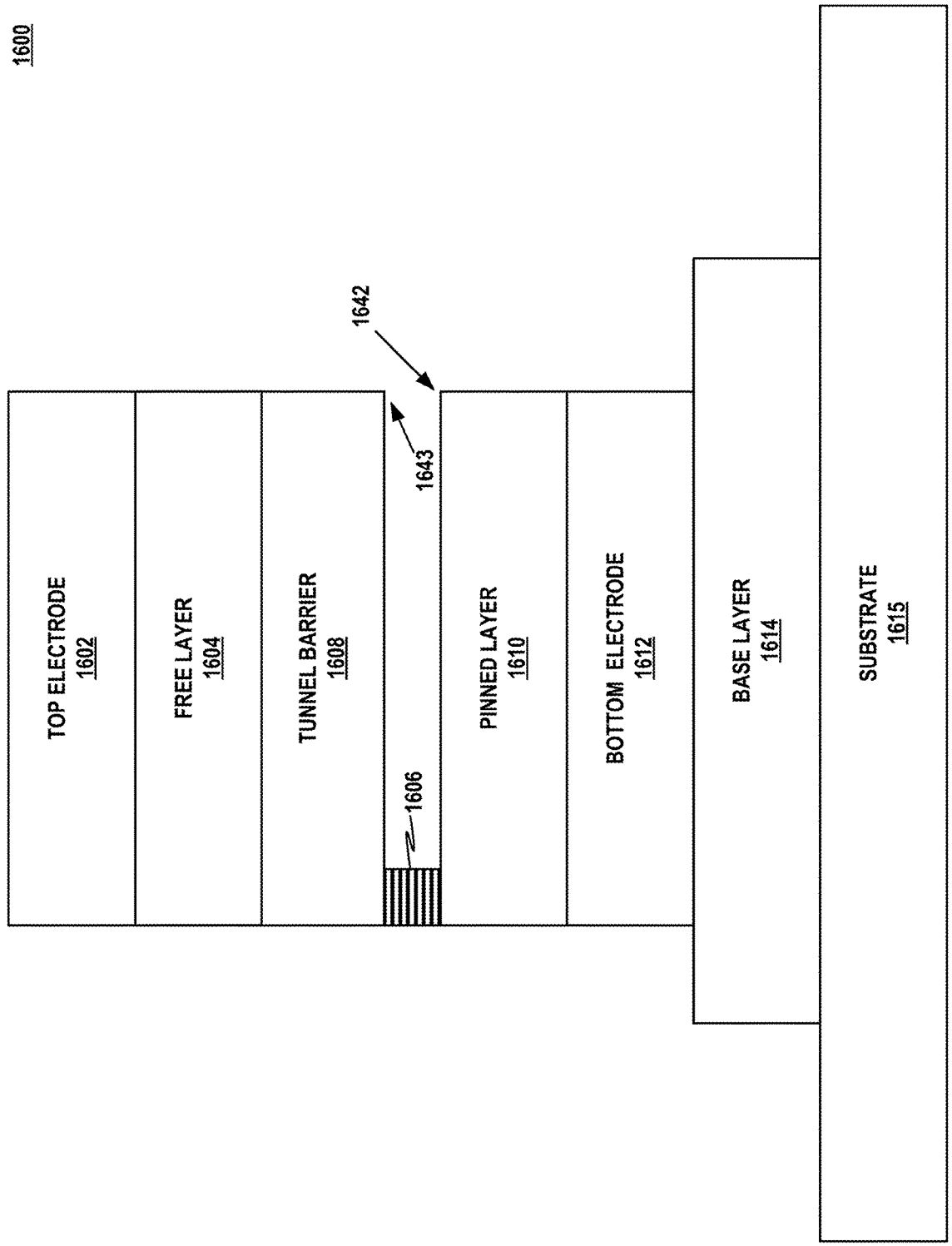
FIG. 16 shows a conceptual illustration of a sixteenth MTJ element configured to detect vibrations and mechanical shock.

FIG. 16 shows a conceptual illustration of a sixteenth MTJ element 1600 configured to detect vibrations and mechanical shock. MTJ element 1600 may include top electrode 1602, free layer 1604, elastic layer 1606, tunnel barrier 1608, pinned layer 1610, bottom electrode 1612, base layer 1614, and substrate 1615, which may be examples of top electrode 102, free layer 104, elastic layer 106, tunnel barrier 108, pinned layer 110, bottom electrode 112, base layer 114, and substrate 115 of FIG. 1, respectively. In this example, elastic layer 1606 is arranged between tunnel barrier 1608 and pinned layer 1610. In the example of FIG. 16, elastic layer 1606 comprises a thin spacer configured to allow modulation of tunneling current in response to shock and/or vibration. As shown, elastic layer 1606 is spaced apart from edge 1642 of pinned layer 1610.

In the example of FIG. 16, tunnel barrier 1608 is spaced apart from pinned layer 1610 by elastic layer 1606. In this example, elastic layer 1606 is arranged below a lower surface of tunnel barrier 1608 and spaced apart from edge 1643 (e.g., a right edge) of the lower surface of tunnel barrier 1608, and elastic layer 1606 is arranged above an upper surface of pinned layer 1610 and spaced apart from edge 1642 (e.g., a right edge) of the upper surface of pinned layer 1610.

Figure 17:
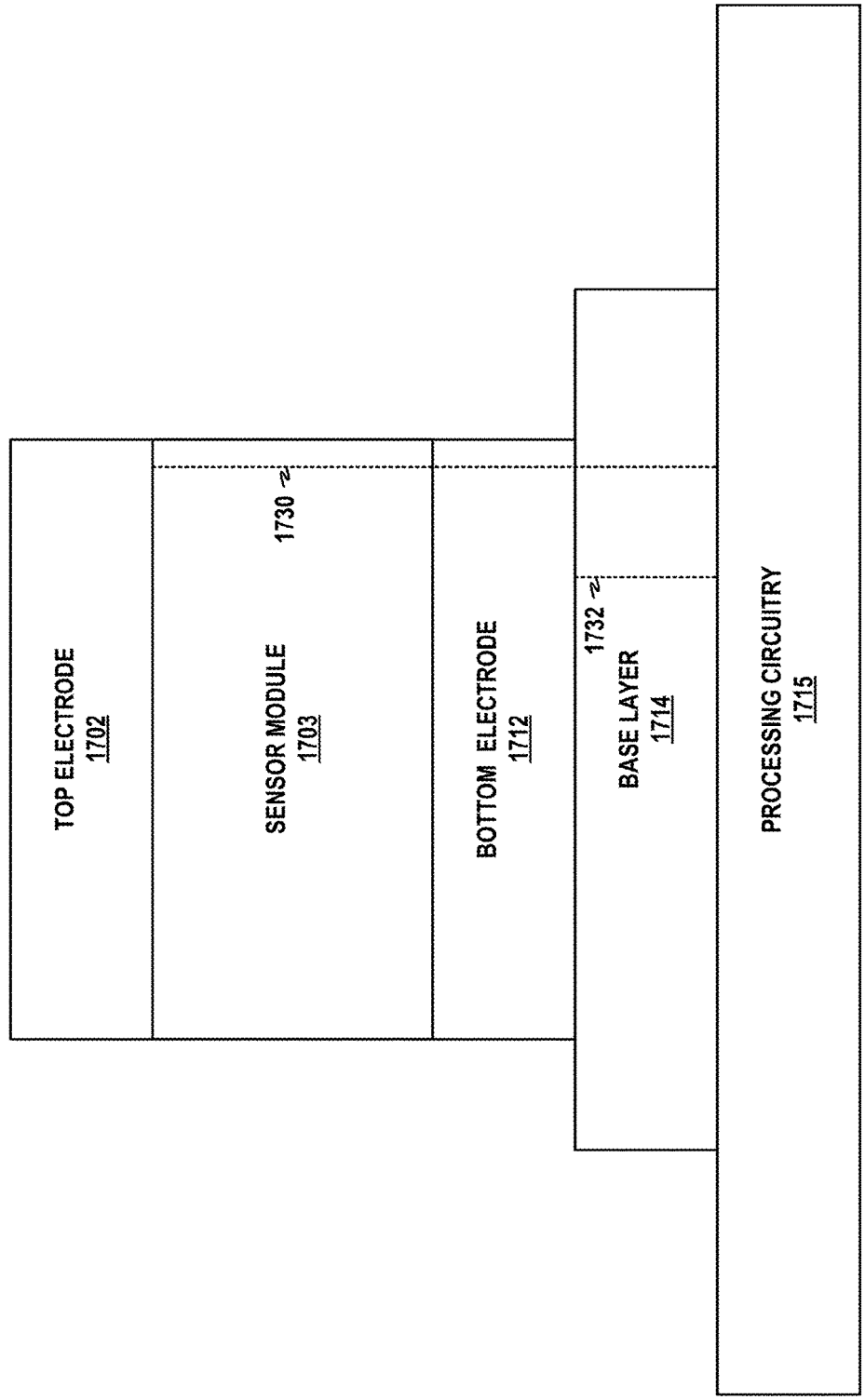
FIG. 17 shows a diagram of a MTJ element that may be used to implement the techniques of the present disclosure.

FIG. 17 shows a diagram of a MTJ element 1700 that may be used to implement the techniques of the present disclosure. MTJ element 1700 may include top electrode 1702, bottom electrode 1712, base layer 1714, and processing circuitry 1715, which may be examples of top electrode 102, bottom electrode 112, base layer 114, and substrate 115 of FIG. 1, respectively. MTJ element 1700 may further include sensor module 1703, which may comprise a free layer, one or more elastic layers, one or more tunnel barriers, and a pinned layer arranged for detecting mechanical shock and vibration (e.g., see FIGS. 1A-1C and 2-16).

Sensor devices implementing one or more of the techniques described in this disclosure may be implemented in a wide array of electronic devices ranging from small portable devices such as music players, smart phones, game cartridges, and memory sticks up to larger devices such as tablet computers, gaming devices or consoles, desktop computers, super computers, and enterprise storage solutions.

Via 1730 and via 1732 may be formed of an electrically conductive material, such as, for example, but not limited to, tungsten, aluminum, aluminum-copper, and/or copper. In the example of FIG. 17, via 1730 electrically connects top electrode 1702 to processing circuitry 1715. In this example, via 1732 electrically connects bottom electrode 1712 to processing circuitry 1715.

Processing circuitry 1715 is configured to monitor the resistance and/or magnetoresistance of MTJ element 1704, which may correspond to a mechanical shock and vibration occurring at MTJ element 1700. This monitoring of the resistance and/or magnetoresistance is termed Rmonitor, which represents the real time measuring of the MTJ element resistance and/or magnetoresistance. For example, if the resistance and/or magnetoresistance of MTJ element 1704 has a rate of change exceeding a threshold, processing circuitry 1715 may determine that mechanical shock and vibration has occurred at MTJ element 1700.

Processing circuitry 1715 may include one or more processors, including one or more microprocessors, digital signal processors (DSPs), ASICs, field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry.

Processing circuitry 1715 may be configured to measure the resistance at MTJ element 1700. For example, processing circuitry 1715 may be configured to measure a resistance between a pinned layer of sensor module 1703 and a free layer of sensor module 1703.

Processing circuitry 1715 may be configured to determine mechanical shock and vibration has occurred when the measured resistance between the pinned layer and the free layer does not satisfy a mechanical shock and vibration threshold. For example, processing circuitry 1715 may be configured to determine mechanical shock and vibration has occurred when the measured resistance between the pinned layer and the free layer is outside (e.g., not within) of a mechanical shock and vibration threshold. In some examples, processing circuitry 1715 may be configured to determine mechanical shock and vibration has occurred when a rate of change of the measured resistance between the pinned layer and the free layer is outside (e.g., not within) of a mechanical shock and vibration threshold. As used herein, the mechanical shock and vibration threshold may be configured by a human user or determined by processing circuitry 1715.

Similarly, processing circuitry 1715 may be configured to determine mechanical shock and vibration has not occurred when the measured resistance between the pinned layer and the free layer satisfies a mechanical shock and vibration threshold. For example, processing circuitry 1715 may be configured to determine mechanical shock and vibration has not occurred when the measured resistance between the pinned layer and the free layer is within (e.g., not outside) a mechanical shock and vibration threshold. In some examples, processing circuitry 1715 may be configured to determine mechanical shock and vibration has not occurred when a rate of change of the measured resistance between the pinned layer and the free layer is within (e.g., not outside) of a mechanical shock and vibration threshold.

Processing circuitry 1715 may determine a magnitude of the mechanical shock and vibration using an amount that the measured resistance exceeds the mechanical shock and vibration threshold. In some examples, processing circuitry 1715 may determine a magnitude of the mechanical shock and vibration using an amount that a rate of change of the measured resistance exceeds the mechanical shock and vibration threshold.

Processing circuitry 1715 may be adapted to output an indication that mechanical shock and vibration has occurred. For example, processing circuitry 1715 may generate a digital signal indicating mechanical shock and vibration has occurred (and an indication of a magnitude of the mechanical shock and vibration). In some examples, processing circuitry 1216 may generate one or more voltages magnitudes indicating mechanical shock and vibration has occurred (and an indication of a magnitude of the mechanical shock and vibration).

Figure 18:
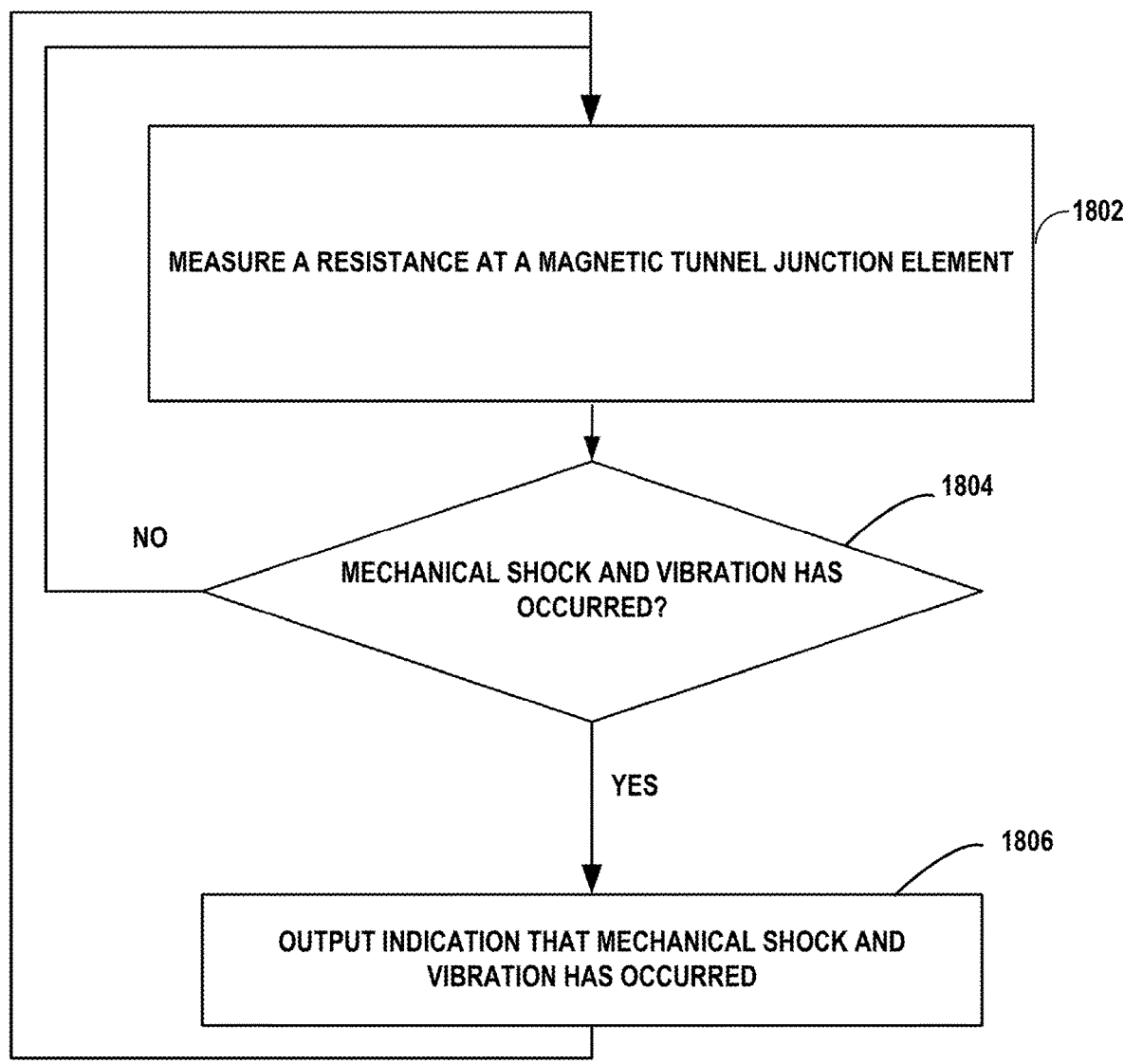
FIG. 18 shows a flowchart of a method for detecting mechanical shock and vibration in accordance with the techniques of this disclosure.

FIG. 18 shows a flowchart of a process for detecting mechanical shock and vibration in accordance with the techniques of this disclosure. The process of FIG. 18 may, for example, be performed by a MTJ element described above with respect to any combination of FIGS. 1-17. Processing circuitry 1715 measures a resistance at a MTJ element (1802). For example, processing circuitry 1715 measures a resistance between a pinned layer of sensor module 1703 and a free layer of sensor module 1703.

Processing circuitry 1715 determines whether mechanical shock and vibration has occurred based on the resistance at the MTJ element (1804). For example, processing circuitry 1715 determines mechanical shock and vibration has occurred when the measured resistance between the pinned layer and the free layer does not satisfy a mechanical shock and vibration threshold. In some examples, processing circuitry 1715 may determine mechanical shock and vibration has occurred when a rate of change of the measured resistance between the pinned layer and the free layer does not satisfy a mechanical shock and vibration threshold.

In response to determining that mechanical shock and vibration has not occurred, the process returns to step 1802. In response, however, to determining that mechanical shock and vibration has occurred, processing circuitry 1715 outputs an indication that mechanical shock and vibration has occurred (1806) and the process returns to step 1802.

The term "circuitry" as used herein may refer to any of the foregoing structure or any other structure suitable for processing program code and/or data or otherwise implementing the techniques described herein. Circuitry may, for example, any of a variety of types of solid state circuit elements, such as CPUs, CPU cores, GPUs, DSPs, ASICs, mixed-signal integrated circuits, FPGAs, microcontrollers, programmable logic controllers (PLCs), programmable logic device (PLDs), complex PLDs (CPLDs), systems on a chip (SoC), any subsection of any of the above, an interconnected or distributed combination of any of the above, or any other integrated or discrete logic circuitry, or any other type of component or one or more components capable of being configured in accordance with any of the examples disclosed herein.

As used in this disclosure, circuitry may also include one or more memory devices, such as any volatile or non-volatile media, such as a RAM, ROM, non-volatile RAM (NVRAM), electrically erasable programmable ROM (EEPROM), flash memory, and the like. The one or more memory devices may store computer-readable instructions that, when executed or processed the circuitry, cause the circuitry to implement the techniques attributed herein to circuitry. The circuitry of this disclosure may be programmed, or otherwise controlled, with various forms of firmware and/or software.

Various illustrative aspects of the disclosure have been described above. These and other aspects are within the scope of the following claims.

The invention claimed is:

1. A magnetic tunnel junction (MTJ) based sensor device, the device comprising:
   a MTJ element comprising a free layer, a pinned layer, an elastic layer, and a tunnel barrier, the free layer being spaced apart from the pinned layer by the tunnel barrier and the elastic layer, wherein the elastic layer changes in thickness in response to one or more of tensional stress or compressional stress; and
   processing circuitry electrically connected to the MTJ element and configured to:
      measure a resistance at the MTJ element; and
      determine whether mechanical shock and vibration has occurred based on the resistance at the MTJ element.

2. The device of claim 1, wherein the free layer is spaced apart from the tunnel barrier by the elastic layer.

3. The device of claim 1, wherein the tunnel barrier is spaced apart from the pinned layer by the elastic layer.

4. The device of claim 1, wherein the elastic layer is a first elastic layer, wherein the free layer is spaced apart from the tunnel barrier by the first elastic layer and wherein the tunnel barrier is spaced apart from the pinned layer by a second elastic layer.

5. The device of claim 1, wherein the tunnel barrier is a first tunnel barrier, wherein the free layer is spaced apart from the elastic layer by the first tunnel barrier, and wherein the elastic layer is spaced apart from the pinned layer by a second tunnel barrier.

6. The device of claim 1, wherein the tunnel barrier is a first tunnel barrier, wherein the elastic layer is a first elastic layer, wherein the free layer is spaced apart from the first elastic layer by the first tunnel barrier, wherein the first elastic layer is spaced apart from a second elastic layer by a second tunnel barrier, and wherein the second tunnel barrier is spaced apart from the pinned layer by the second elastic layer.

7. The device of claim 1, wherein the tunnel barrier is a first tunnel barrier, wherein the elastic layer is a first elastic layer, wherein the free layer is spaced apart from the first tunnel barrier by the first elastic layer, wherein the first tunnel barrier is spaced apart from a second tunnel barrier by a second elastic layer, and wherein the second elastic layer is spaced apart from the pinned layer by the second tunnel barrier.

8. The device of claim 1, wherein the tunnel barrier is a first tunnel barrier, wherein the elastic layer is a first elastic layer, wherein the free layer is spaced apart from the first tunnel barrier by the first elastic layer, wherein the first tunnel barrier is spaced apart from a second tunnel barrier by a second elastic layer, and wherein the second tunnel barrier is spaced apart from the pinned layer by a third elastic layer.

9. The device of claim 1, wherein the tunnel barrier is a first tunnel barrier, wherein the first tunnel barrier is spaced apart from a second tunnel barrier by the elastic layer, wherein the elastic layer is arranged below a lower surface of the first tunnel barrier and spaced apart from a first edge of the lower surface of the first tunnel barrier, and wherein the elastic layer is arranged above an upper surface of the second tunnel barrier and spaced apart from a first edge of the upper surface of the second tunnel barrier.

10. The device of claim 9, wherein the elastic layer is spaced apart from a second edge of the lower surface of the first tunnel barrier and wherein the elastic layer is spaced apart from a second edge of the upper surface of the second tunnel barrier.

11. The device of claim 1, wherein the free layer is spaced apart from the tunnel barrier by the elastic layer, wherein the elastic layer is arranged below a lower surface of the free layer and spaced apart from a first edge of the lower surface of the free layer, and wherein the elastic layer is arranged above an upper surface of the tunnel barrier and spaced apart from a first edge of the upper surface of the tunnel barrier.

12. The device of claim 11, wherein the elastic layer spaced apart from a second edge of the lower surface of the free layer and wherein the elastic layer is spaced apart from a second edge of the upper surface of the tunnel barrier.

13. The device of claim 1, wherein the tunnel barrier is spaced apart from the pinned layer by the elastic layer, wherein the elastic layer is arranged below a lower surface of the tunnel barrier and spaced apart from a first edge of the lower surface of the tunnel barrier, and wherein the elastic layer is arranged above an upper surface of the pinned layer and spaced apart from a first edge of the upper surface of the pinned layer.

14. The device of claim 13, wherein the elastic layer spaced apart from a second edge of the lower surface of the tunnel barrier and wherein the elastic layer is spaced apart from a second edge of the upper surface of the pinned layer.

15. The device of claim 1,
   wherein, to measure the resistance at the MTJ element, the processing circuitry is configured to measure a resistance between the pinned layer and the free layer; and
   wherein, to determine whether mechanical shock and vibration has occurred, the processing circuitry is configured to:
      determine mechanical shock and vibration has occurred when the measured resistance between the pinned layer and the free layer does not satisfy a mechanical shock and vibration threshold; and
      determine mechanical shock and vibration has not occurred when the measured resistance between the pinned layer and the free layer satisfies the mechanical shock and vibration threshold.

16. The device of claim 1, wherein the elastic layer comprises one or more sheets of Carbon, Graphene, an Elastomer.

17. A method for detecting mechanical shock and vibration using a magnetic tunnel junction (MTJ) based sensor device, the method comprising:
   measuring, by processing circuitry, a resistance at a MTJ element, wherein the MTJ element comprises a free layer, a pinned layer, an elastic layer, and a tunnel barrier, the free layer being spaced apart from the pinned layer by the tunnel barrier and the elastic layer, wherein the elastic layer changes in thickness in response to one or more of tensional stress or compressional stress; and
   determining, by the processing circuitry, whether mechanical shock and vibration has occurred based on the resistance at the MTJ element.

18. The method of claim 17,
   wherein measuring the resistance at the MTJ element comprises measuring a resistance between the pinned layer and the free layer; and
   wherein determining whether mechanical shock and vibration has occurred comprises:
      determining mechanical shock and vibration has occurred when the measured resistance between the pinned layer and the free layer does not satisfy a mechanical shock and vibration threshold; and
      determining vibration threshold and determine mechanical shock and vibration has not occurred when the measured resistance between the pinned layer and the free layer satisfies the mechanical shock and vibration threshold.

19. A magnetic tunnel junction (MTJ) based sensor device, the device comprising:
   means for measuring a resistance at a MTJ element, wherein the MTJ element comprises a free layer, a pinned layer, an elastic layer, and a tunnel barrier, the free layer being spaced apart from the pinned layer by the tunnel barrier and the elastic layer, wherein the elastic layer changes in thickness in response to one or more of tensional stress or compressional stress; and
   means for determining whether mechanical shock and vibration has occurred based on the resistance at the MTJ element.

20. The device of claim 1, wherein the resistance at the MTJ element is dependent on the thickness of the elastic layer.

* * * * *